(12) United States Patent
Yagi et al.

(10) Patent No.: US 6,201,292 B1
(45) Date of Patent: Mar. 13, 2001

(54) RESIN-SEALED SEMICONDUCTOR DEVICE, CIRCUIT MEMBER USED THEREFOR

(75) Inventors: Hiroshi Yagi; Yoichi Hitomi; Makoto Nakamura; Masato Sasaki, all of Saitama-ken (JP)

(73) Assignee: Dai Nippon Insatsu Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/052,984

(22) Filed: Apr. 1, 1998

(30) Foreign Application Priority Data

| Apr. 2, 1997 | (JP) | 9-097885 |
| Jul. 11, 1997 | (JP) | 9-201001 |
| Jul. 16, 1997 | (JP) | 9-205520 |
| Oct. 3, 1997 | (JP) | 9-287993 |

(51) Int. Cl.$^7$ ................................................ H01L 23/495
(52) U.S. Cl. .......................... 257/666; 257/692; 257/676
(58) Field of Search ........................ 257/775, 676, 257/692, 739, 666

(56) References Cited

U.S. PATENT DOCUMENTS

| 4,774,635 | * | 9/1988 | Greenberg et al. | 361/42 |
| 5,006,917 | * | 4/1991 | Kang et al. | 357/70 |
| 5,635,755 | * | 6/1997 | Kinghorn | 257/666 |
| 5,663,594 | * | 9/1997 | Kimura | 257/666 |
| 5,834,831 | * | 11/1998 | Kubota et al. | 257/674 |
| 5,977,613 | * | 11/1999 | Takata et al. | 257/666 |

\* cited by examiner

*Primary Examiner*—Roy Potter
(74) *Attorney, Agent, or Firm*—Oblon, Spivak, McClelland, Maier & Neustadt, P.C.

(57) ABSTRACT

There is disclosed a resin-sealed semiconductor device in which plural terminal portions each integrally having an inner terminal on a surface and an outer terminal on a rear face are arranged two-dimensionally substantially in a plane electrically independent of one another. A die pad is electrically independently disposed in a substantially middle portion in the plane where the terminal portions are arranged two-dimensionally. A semiconductor element is mounted on the die pad. The inner terminals of the terminal portions are electrically connected via wires to terminals of the semiconductor element, and the entirety is sealed with a resin in such a manner that the outer terminals of the terminal portions are partially exposed to the outside. Therefore, an occupancy ratio of the semiconductor element in the semiconductor device is increased. The semiconductor device can be miniaturized. The mounting density onto a circuit substrate can be enhanced. Also, by forming outer electrodes on the outer terminals, different from the conventional TSOP or another small-sized semiconductor device, multiple pins can be easily provided.

62 Claims, 17 Drawing Sheets

RESIN-SEALED SEMICONDUCTOR DEVICE, CIRCUIT MEMBER USED THEREFOR

BACKGROUND OF THE INVENTION

1. Technical Field

The present invention relates to a resin-sealed semiconductor device with a semiconductor element mounted thereon, a circuit member for use in the same and a method of manufacturing a resin-sealed semiconductor device.

2. Background Art

Recently, for semiconductor devices, a progress in technique for high integration and miniaturization and a tendency (trend) toward higher performance and reduction in thickness and size of electronic equipment have resulted in an ever-increasing demand for higher integration and function such as typified by ASIC (application-specific IC) of LSI.

Accordingly, a trend of development also in a resin-sealed semiconductor device using a lead frame has progressed from a surface mounting package such as SOJ (small outline J-bend package) and QFP (quad flat package) via a package reduced mainly in thickness such as TSOP (thin small outline package) further to a structure like LOC (lead on chip) for enhancing a chip storage efficiency by means of a three-dimensional package inner structure.

However, a resin-sealed semiconductor device package having increased integration density and function is further demanded to be provided with multiple pins and have a thin and small structure. In the aforementioned conventional package, since lead wires are drawn around in an outer peripheral portion of the semiconductor element, the miniaturization of the package appears to be restricted.

Also, in the TSOP or another small-sized package, the provision of multiple pins appears to be restricted in respect of a drawn-around lead and a pin pitch.

SUMMARY OF THE INVENTION

Wherefore, an object of the invention is to provide a resin-sealed semiconductor device which can realize a high storage efficiency of semiconductor element chips and miniaturization and enhance a mounting density onto a circuit substrate, a resin-sealed semiconductor device which can cope with a demand for multiple pins, a circuit member for use in the semiconductor device and a method of manufacturing a semiconductor device.

To attain this and other objects, the invention provides a resin-sealed semiconductor device in which plural terminal portions each having an inner terminal on a surface and an outer terminal on a rear face with the inner and outer terminals being integrally formed are arranged two-dimensionally substantially in a plane electrically independent of one another. The inner terminals of the terminal portions are electrically connected via wires to terminals of a semiconductor element. The entirety is sealed with a resin in such a manner that the outer terminals of the terminal portions are partially exposed to the outside. A die pad is electrically independently disposed in a substantially middle portion in the plane in which the terminal portions are arranged two-dimensionally. The semiconductor element is mounted on the die pad.

Also, the invention provides a resin-sealed semiconductor device in which plural terminal portions each having an inner terminal on a surface and an outer terminal on a rear face with the inner and outer terminals being integrally formed are arranged two-dimensionally substantially in a plane electrically independent of one another. The inner terminals of the terminal portions are electrically connected via wires to terminals of a semiconductor element. The entirety is sealed with a resin in such a manner that the outer terminals of the terminal portions are partially exposed to the outside. Leads are integrally interconnected to the terminal portions along the plane in which the plural terminal portions are arranged two-dimensionally. The leads are arranged electrically independent of one another. The semiconductor element is electrically insulated and mounted on the plural leads.

The invention provides a circuit member which is provided with an outer frame member, plural terminal portions independently connected via connection leads to the outer frame member and a die pad connected via connection leads to the outer frame member. Each terminal portion has an inner terminal on a surface and an outer terminal on a rear face with the inner and outer terminals being integrally formed. An inner terminal face of each terminal portion is positioned substantially on a plane.

Also, the invention provides a circuit member which is provided with an outer frame member and plural terminal portions independently connected via connection leads to the outer frame member. Each terminal portion has an inner terminal on a surface and an outer terminal on a rear face with the inner and outer terminals being integrally formed. An inner terminal face of each terminal portion is positioned substantially on a plane. Along the plane, leads for mounting a semiconductor element are integrally interconnected to the terminal portions.

The invention provides a method of manufacturing a resin-sealed semiconductor device. In the method, plural terminal portions each having an inner terminal on a surface and an outer terminal on a rear face with the inner and outer terminals being integrally formed are arranged two-dimensionally substantially on a plane electrically independent of one another. The inner terminals of the terminal portions are electrically connected via wires to terminals of a semiconductor element. The entirety is sealed with a resin in such a manner that the outer terminals of the terminal portions are partially exposed to the outside. The manufacture method is provided with following processes:

(A) a circuit member preparing process for etching a conductive substrate to form a circuit member which is provided with plural terminal portions each having an inner terminal on a surface and an outer terminal on a rear face with the inner and outer terminals being integrally formed, a die pad and an outer frame member to which the terminal portions are integrally interconnected via connection leads independent of one another and to which the die pad is integrally interconnected via connection leads;

(B) a semiconductor element mounting process for fixing and mounting the semiconductor element to the die pad;

(C) a wire bonding process for electrically connecting terminals of the semiconductor element and the inner terminals of the circuit member via wires;

(D) a resin sealing process for sealing the entirety with a resin in such a manner that the outer terminals are partially exposed to the outside; and (E) an outer frame member removing process for cutting the connection leads of the circuit member to remove the outer frame member.

Also, the invention provides a method of manufacturing a resin-sealed semiconductor device. In the method, plural terminal portions each having an inner terminal on a surface and an outer terminal on a rear face with the inner and outer terminals being integrally formed are arranged two-dimensionally substantially in a plane electrically independent of one another. The inner terminals of the terminal portions are electrically connected via wires to terminals of a semiconductor element. The entirety is sealed with a resin in such a manner that the outer terminals of the terminal portions are partially exposed to the outside. The manufacture method is provided with following processes:

(A) a circuit member preparing process for etching a conductive substrate to form a circuit member which is provided with plural terminal portions each having an inner terminal on a surface and an outer terminal on a rear face with the inner and outer terminals being integrally formed, an outer frame member to which the terminal portions are integrally interconnected via connection leads independent of one another and leads integrally interconnected to the terminal portions for mounting a semiconductor element thereon;

(B) a semiconductor element mounting process for insulating, fixing and mounting the semiconductor element on the semiconductor element mounting leads;

(C) a wire bonding process for electrically connecting terminals of the semiconductor element and the inner terminals of the circuit member via wires;

(D) a resin sealing process for sealing the entirety with a resin in such a manner that the outer terminals are partially exposed to the outside; and (E) an outer frame member removing process for cutting the connection leads of the circuit member to remove the outer frame member.

As aforementioned, in the invention an occupancy ratio of the semiconductor element in the resin-sealed semiconductor device is increased. Therefore, the semiconductor device can be miniaturized. The mounting density onto the circuit substrate can be enhanced. Also, by forming outer electrodes on the outer terminals, different from the conventional TSOP or another small-sized semiconductor device, multiple pins can be easily provided.

BRIEF DESCRIPTION OF THE DRAWINGS

FIGS. 28A, 28B, 28C, 28D, 28E 28 is a process diagram showing another example of the method of manufacturing the resin-sealed semiconductor device according to the invention.

DETAILED DESCRIPTION OF THE PREFERRED EMBODIMENTS

Preferred embodiments of the invention will be described with reference to the accompanying drawings.

Resin-Sealed Semiconductor Device

Figure 1:
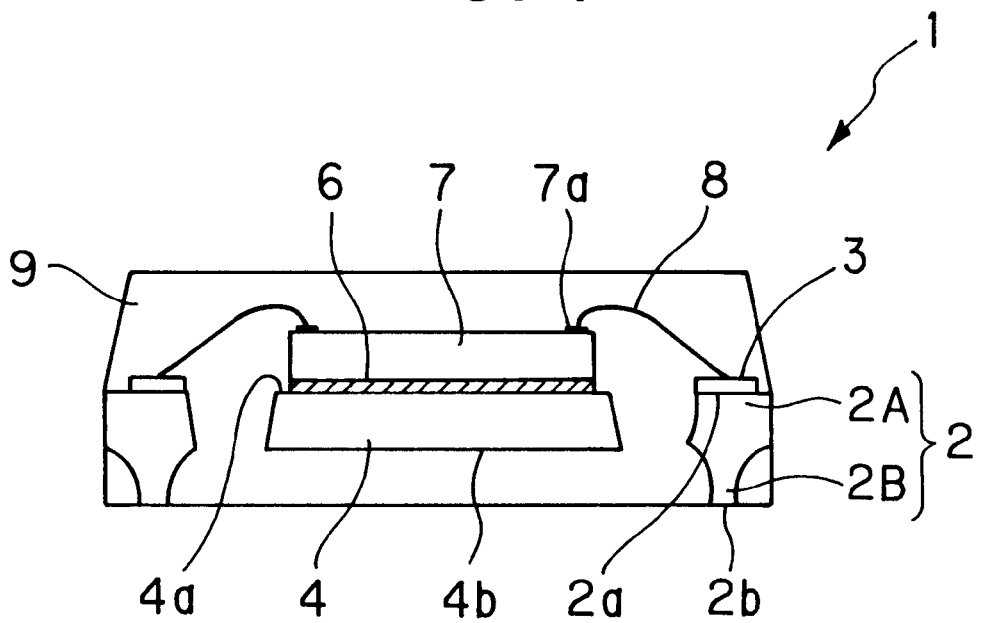
FIG. 1 is a diagrammatic view showing a resin-sealed semiconductor device according to an embodiment of the invention.
Figure 2:
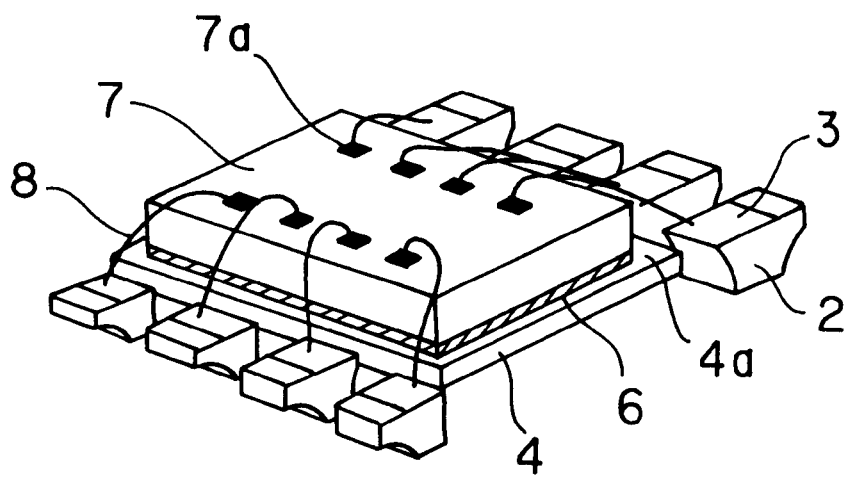
FIG. 2 is a perspective view of an inner constitution of the resin-sealed semiconductor device shown in FIG. 1.

First, a resin-sealed semiconductor device of the invention will be described. FIG. 1 is a diagrammatic view showing an embodiment of the resin-sealed semiconductor device according to the invention, while FIG. 2 is a perspective view showing an inner constitution of the resin-sealed semiconductor device shown in FIG. 1. In the resin-sealed semiconductor device 1 of the invention shown in FIGS. 1 and 2, plural terminal portions 2 are arranged electrically independent of one another in two rows two-dimensionally substantially in a plane. A die pad 4 is disposed in a substantially middle portion of the arranged terminal portions 2. The die pad 4 has a rectangular surface configuration. A face opposite to a terminal face of a semiconductor element 7 is fixed and mounted via an adhesive 6 onto a surface 4a of the die pad 4.

The terminal portion 2 has an inner terminal 2A on a surface and an outer terminal 2B on a rear face with the inner and outer terminals being integrally formed. In FIGS. 1 and 2, an exposed surface 2a of each inner terminal 2A is positioned substantially on a plane. The exposed surface 2a is provided with a silver plating layer 3. Instead of the silver plating layer 3, a gold plating layer, a palladium plating layer or the like may be formed.

The die pad 4 is thinner than the terminal portion 2. A surface 4a of the die pad 4 is disposed in the same plane as a plane formed by the exposed surface 2a of each inner terminal 2A. A rear face 4b is positioned inside an exposed surface 2b of the outer terminal 2B.

Also, terminals 7a of the semiconductor element 7 mounted on the die pad 4 are connected via wires 8 to the inner terminals 2A (silver plating layers 3) of the terminal portions 2.

Then, the terminal portions 2, the die pad 4, the semiconductor element 7 and the wires 8 are sealed by a sealing member 9 in such a manner that the outer terminals 2B are partially exposed to the outside. For the sealing member 9, a known sealing resin material for use in the resin-sealed semiconductor device can be used. In the embodiment shown in FIG. 1, only the exposed surfaces 2b of the outer terminals 2B are exposed to the outside.

Figure 3:
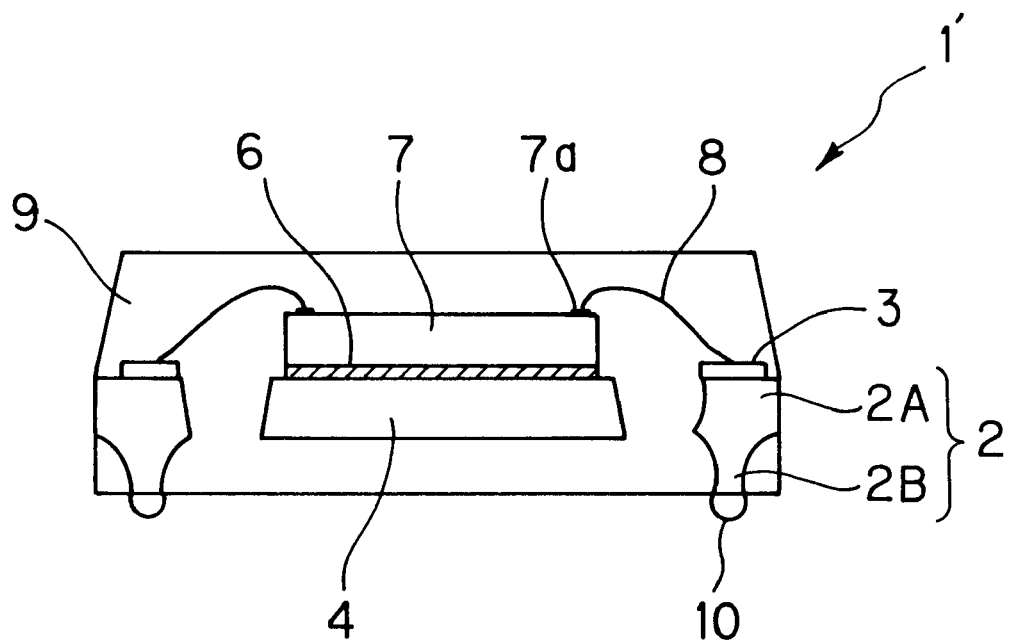
FIGS. 3 to 8 are diagrammatic views showing other embodiments of the resin-sealed semiconductor device of the invention.

FIG. 3 is a diagrammatic view showing another embodiment of the resin-sealed semiconductor device of the invention. In FIG. 3, a resin-sealed semiconductor device 1' of the invention is constituted by forming outer electrodes 10 of solder materials onto the exposed surfaces 2b of the outer terminals 2B of the aforementioned resin-sealed semiconductor device 1. Thereby, a BGA (ball grid array) semiconductor device is formed. When the resin-sealed semiconductor device 1' is mounted on a circuit substrate, the outer terminals 2B are electrically connected to an outer circuit by melting and solidifying the outer electrodes 10.

Figure 4:
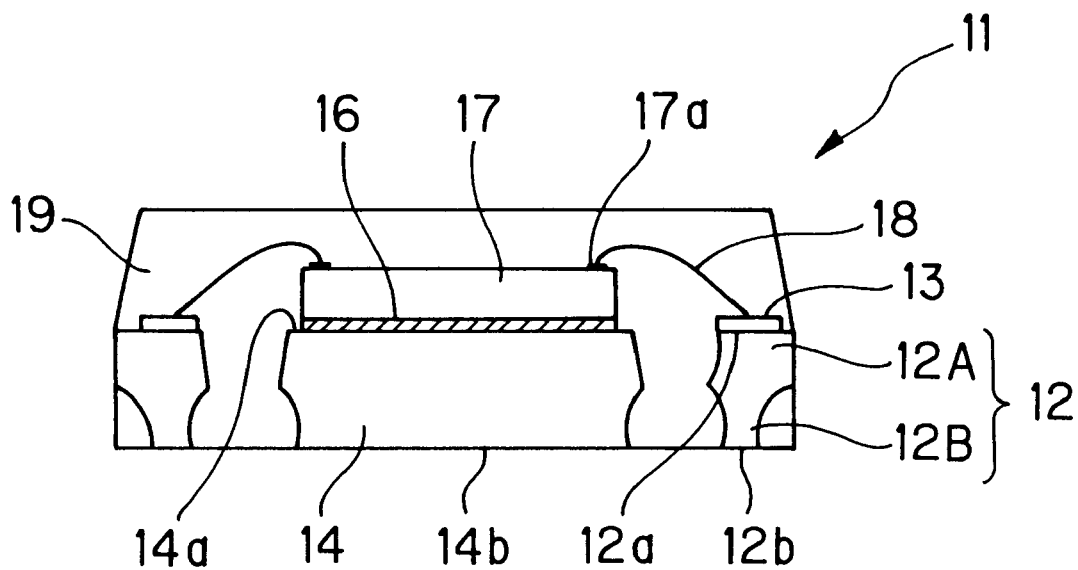

FIG. 4 is a diagrammatic view showing another embodiment of the resin-sealed semiconductor device of the invention. In a resin-sealed semiconductor device 11 of the invention shown in FIG. 4, plural terminal portions 12 are arranged two-dimensionally in two rows substantially on a plane and electrically independent of one another. A die pad 14 is disposed in a substantially middle portion of the arranged terminal portions 12. The die pad 14 has a rectangular surface configuration. A face opposite to a terminal face of a semiconductor element 17 is fixed and mounted via an adhesive 16 onto a surface 14a of the die pad 14.

The terminal portion 12 has an inner terminal 12A on a surface and an outer terminal 12B on a rear face with the inner and outer terminals being integrally formed. In FIG. 4, an exposed surface 12a of each inner terminal 12A is positioned substantially on a plane. The exposed surface 12a is provided with a silver plating layer 13.

The die pad 14 is as thick as the terminal portion 12. A surface 14a of the die pad 14 is disposed in the same plane as a plane formed by the exposed surface 12a of each inner terminal 12A. A rear face 14b is positioned in the same plane as a plane formed by an exposed surface 12b of the outer terminal 12B.

Also, terminals 17a of the semiconductor element 17 mounted on the die pad 14 are connected via wires 18 to the inner terminals 12A (silver plating layers 13) of the terminal portions 12.

Then, the terminal portions 12, the die pad 14, the semiconductor element 17 and the wires 18 are sealed by a sealing member 19 in such a manner that the portions (exposed surfaces 12b) of the outer terminals 12B and the rear face 14b of the die pad 14 are exposed to the outside.

In the resin-sealed semiconductor device 11, heat generated by the semiconductor element 17 is conducted to the die pad 14 which has a high thermal conductivity. Thereafter, the heat is efficiently radiated via the die pad 14 to the outside. The resin-sealed semiconductor device 11 thus has a remarkably good radiation property.

Figure 5:
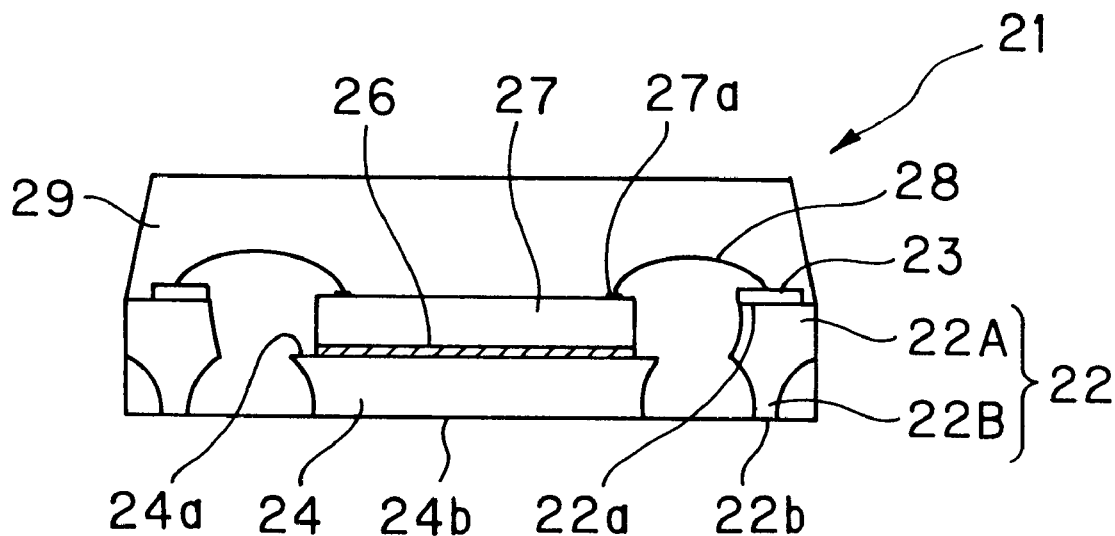

FIG. 5 is a diagrammatic view showing another embodiment of the resin-sealed semiconductor device of the invention. In a resin-sealed semiconductor device 21 of the invention shown in FIG. 5, plural terminal portions 22 are arranged two-dimensionally in two rows substantially on a plane and electrically independent of one another. A die pad 24 is disposed in a substantially middle portion of the arranged terminal portions 22. The die pad 24 has a rectangular surface configuration. A face opposite to a terminal face of a semiconductor element 27 is fixed and mounted via an adhesive 26 onto a surface 24a of the die pad 24.

The terminal portion 22 has an inner terminal 22A on a surface and an outer terminal 22B on a rear face with the inner and outer terminals being integrally formed. In FIG. 5, an exposed surface 22a of each inner terminal 22A is positioned substantially on a plane. The exposed surface 22a is provided with a silver plating layer 23.

The die pad 24 is thinner than the terminal portion 22. A surface 24a of the die pad 24 is disposed outside a plane formed by the exposed surface 22a of each inner terminal 22A. A rear face 24b of the die pad 24 is positioned in the same plane as a plane formed by an exposed surface 22b of the outer terminal 22B.

Also, terminals 27a of the semiconductor element 27 mounted on the die pad 24 are connected via wires 28 to the inner terminals 22A (silver plating layers 23) of the terminal portions 22.

Then, the terminal portions 22, the die pad 24, the semiconductor element 27 and the wires 28 are sealed by a sealing member 29 in such a manner that the portions (exposed surfaces 22b) of the outer terminals 22B and the rear face 24b of the die pad 24 are exposed to the outside.

In the resin-sealed semiconductor device 21, heat generated by the semiconductor element 27 is conducted to the die pad 24 which has a high thermal conductivity. Thereafter, the heat is efficiently radiated via the die pad 24 to the outside. The resin-sealed semiconductor device 21 thus has a remarkably good radiation property. Also, there is provided a large allowance in loop height of each wire 28 for connecting each terminal 27a of the semiconductor element 27 and each inner terminal 22A (silver plating layer 23) of the terminal portion 22.

Figure 6:
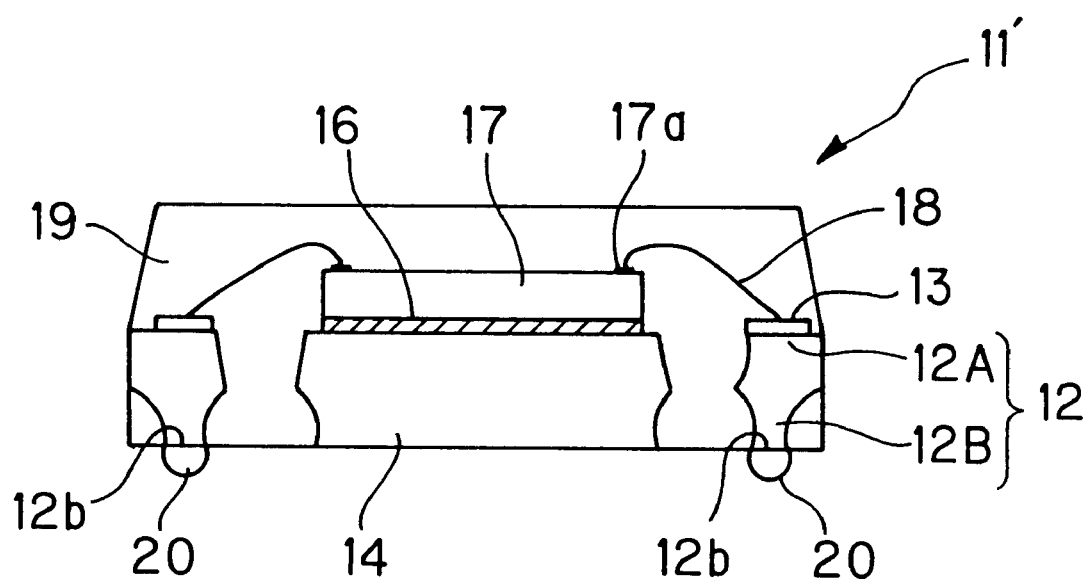
Figure 7:
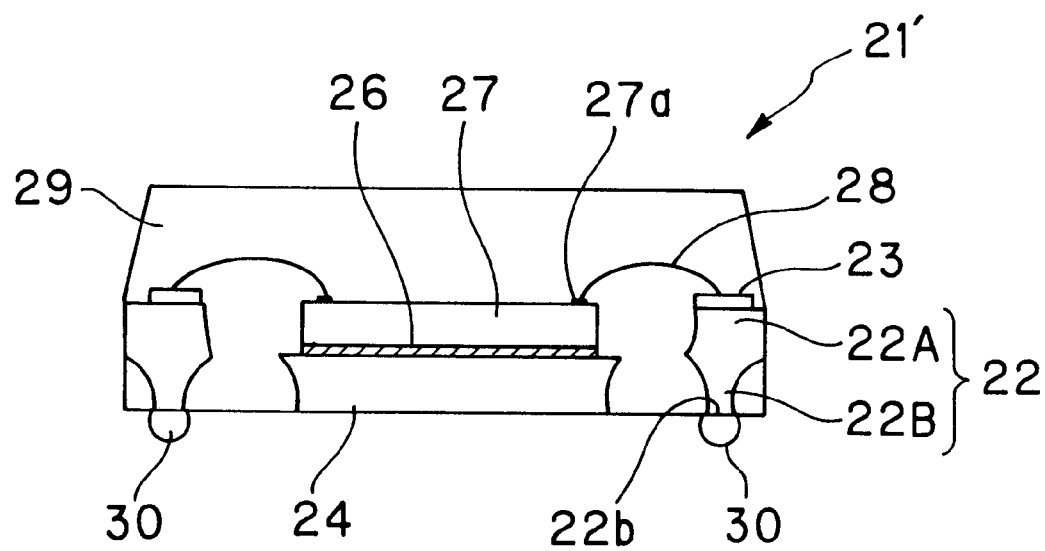

FIGS. 6 and 7 are diagrammatic views showing other embodiments of the resin-sealed semiconductor device of the invention. A resin-sealed semiconductor device 11' of the invention shown in FIG. 6 is constituted by forming outer electrodes 20 constituted of solder materials onto the exposed surfaces 12b of the outer terminals 12B of the aforementioned resin-sealed semiconductor device 11. Also, a resin-sealed semiconductor device 21' of the invention shown in FIG. 7 is constituted by forming outer electrodes 30 constituted of solder materials onto the exposed surfaces 22b of the outer terminals 22B of the aforementioned resin-sealed semiconductor device 21. These resin-sealed semiconductor devices 11' and 21' are BGA (ball grid array) semiconductor devices. When the resin-sealed semiconductor device 11' or 21' is mounted on a circuit substrate, the outer terminals 12B or 22B are electrically connected to an outer circuit by melting and solidifying the outer electrodes 20 or 30.

Figure 8:
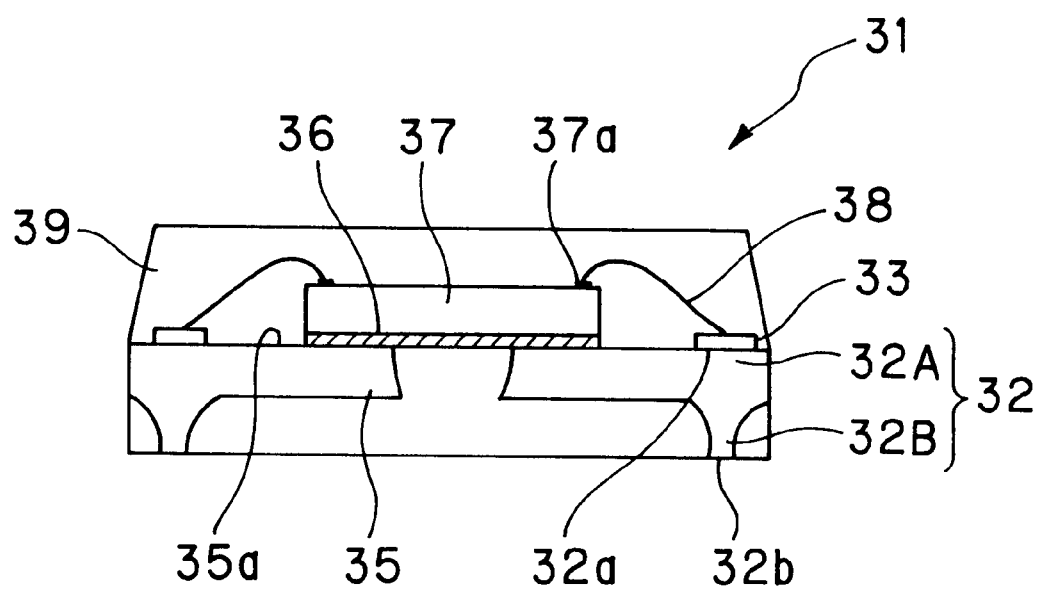
Figure 9:
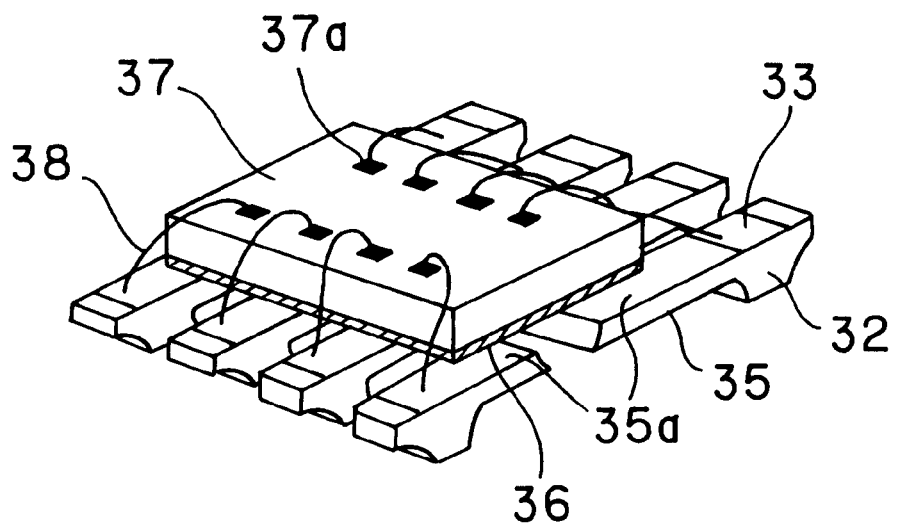
FIG. 9 is a perspective view of an inner constitution of the resin-sealed semiconductor device shown in FIG. 8.

FIG. 8 is a diagrammatic view showing another embodiment of the resin-sealed semiconductor device of the invention, while FIG. 9 is a perspective view showing an inner constitution of the resin-sealed semiconductor device shown in FIG. 8. In a resin-sealed semiconductor device 31 shown in FIGS. 8 and 9, plural terminal portions 32 are arranged two-dimensionally in two rows substantially on a plane and electrically independent of one another. A face opposite to a terminal face of a semiconductor element 37 is fixed and mounted via an insulating adhesive 36 or an insulating adhesive film 36 onto leads 35 which are integrally interconnected with the terminal portions 32 for mounting the semiconductor element thereon.

The terminal portion 32 has an inner terminal 32A on a surface and an outer terminal 32B on a rear face with the inner and outer terminals being integrally formed. In FIG. 8, an exposed surface 32a of each inner terminal 32A is positioned substantially on a plane. The exposed surface 32a is provided with a silver plating layer 33.

The lead 35 is integrally interconnected with each terminal portion 32 and is thinner than the terminal portion 32. A surface 35a of the lead 35 forms the same plane as a plane which is formed by the exposed surface 32a of each inner terminal 32A.

Also, terminals 37a of the semiconductor element 37 mounted on the surfaces 35a of the leads 35 are connected via wires 38 to the inner terminals 32A (silver plating layers 33) of the terminal portions 32.

Then, the terminal portions 32, the leads 35, the semiconductor element 37 and the wires 38 are sealed by a sealing member 39 in such a manner that the portions (exposed surfaces 32b) of the outer terminals 32B are exposed to the outside.

Figure 10:
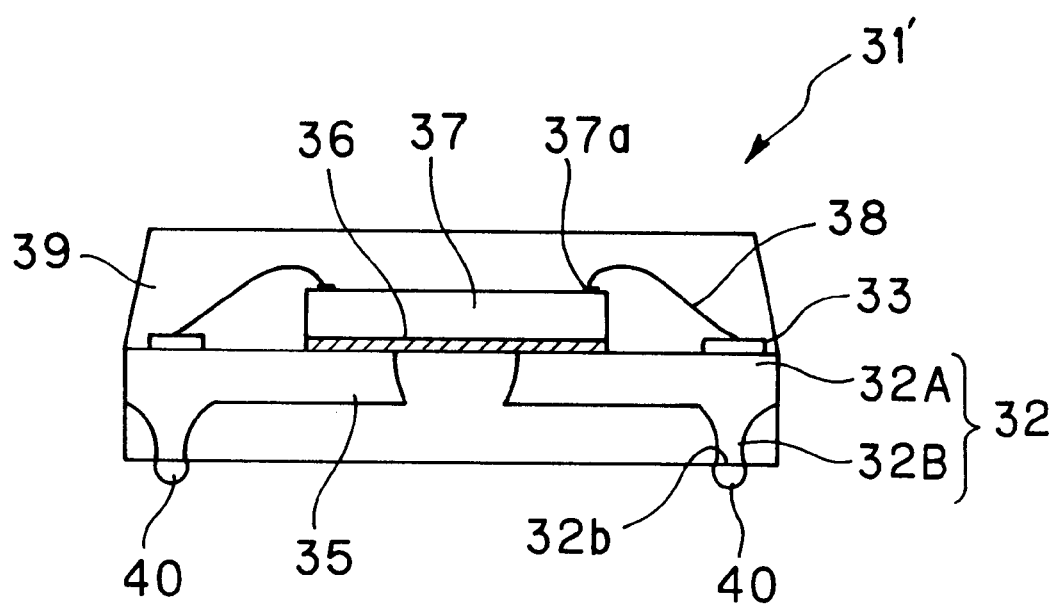
FIG. 10 is a diagrammatic view showing another embodiment of the resin-sealed semiconductor device of the invention.

FIG. 10 is a diagrammatic view showing another embodiment of the resin-sealed semiconductor device of the invention. A resin-sealed semiconductor device 31' of the invention shown in FIG. 10 is constituted by forming outer electrodes 40 constituted of solder materials onto the exposed surfaces 32b of the outer terminals 32B of the aforementioned resin-sealed semiconductor device 31. Thereby, a BGA (ball grid array) semiconductor device is formed. When the resin-sealed semiconductor device 31' is mounted on a circuit substrate, the outer terminals 32B are electrically connected to an outer circuit by melting and solidifying the outer electrodes 40.

Each of the resin-sealed semiconductor devices of the invention shown in FIGS. 1 to 10 has a small difference between its entire size and an area of the semiconductor element. The miniaturized semiconductor device is realized. Also, the thickness of the semiconductor device is reduced to about 1 mm or less. The reduction in thickness can be simultaneously achieved.

Also, in each of the resin-sealed semiconductor devices shown in FIGS. 1 to 10, the terminal portions are arranged along a pair of sides of the semiconductor element, to which the arrangement is not limited. For example, the terminals of the semiconductor element are arranged along four sides of the semiconductor element. In this case, the terminal portions are arranged two-dimensionally along the periphery of the semiconductor element. Thereby, multiple pins can be provided for the resin-sealed semiconductor device.

Further in each of the resin-sealed semiconductor devices of the invention shown in FIGS. 1 to 10, when the terminal portions 2, 12, 22 or 32, the die pad 4, 14 or 24 and the leads 35 are constituted of a copper or a copper-base alloy, a nickel plating layer and a palladium plating layer may be sequentially laminated at least on the resin sealed region. In this case, after the surface of copper or copper-base alloy material is roughed, the nickel plating layer and the palladium plating layer are formed in order on the roughed surface. By providing the palladium plating layer, adhesion is enhanced as compared with the case where the sealing resin material directly plats on the copper or copper-base alloy material. Also, in the wire bonding process the nickel plating layer prevents copper from being dispersed on the bonded face. Additionally, the nickel plating layer serves as a base layer when the palladium layer is laminated on the copper or copper-base alloy material.

As the surface roughing process of the copper or copper-base alloy material, a chemical polishing process is available in which by etching the surface with an organic acid liquid or another etching liquid, fine irregularities are formed on the surface. This process is not restrictive.

Through the surface roughing process, the surface of the copper or copper-base alloy material has a center line average roughness Ra of 1.0 μm or more according to JIS B0601. Especially the adhesion of the copper or copper-base alloy material to the nickel plating layer is improved. Also, when the center line average roughness Ra according to JIS B0601 on the surface of the nickel plating layer is set to 0.045 μm or more, especially the adhesion of the nickel plating layer to the palladium plating layer is improved.

Additionally, when the nickel plating layer and the palladium plating layer are formed in order on the copper or copper-base alloy material as aforementioned, a silver or another noble metal plating layer may be formed on the palladium plating layer in the wire bonded region and the die bonded region.

Also, when the terminal portions 2, 12, 22 or 32, the die pad 4, 14 or 24 and the leads 35 are formed not of the copper or copper-base alloy material but of Alloy 42 (iron-base alloy containing 41% of nickel) or another iron-base alloy material, the palladium plating layer may be formed directly on the iron-base alloy material. In this case, by setting the center line average roughness Ra of JIS B0601 of an iron-base alloy material surface to 0.1 μm or more through the surface roughing process, the adhesion between the iron-base alloy material and the palladium plating layer is preferably raised.

Figure 11:
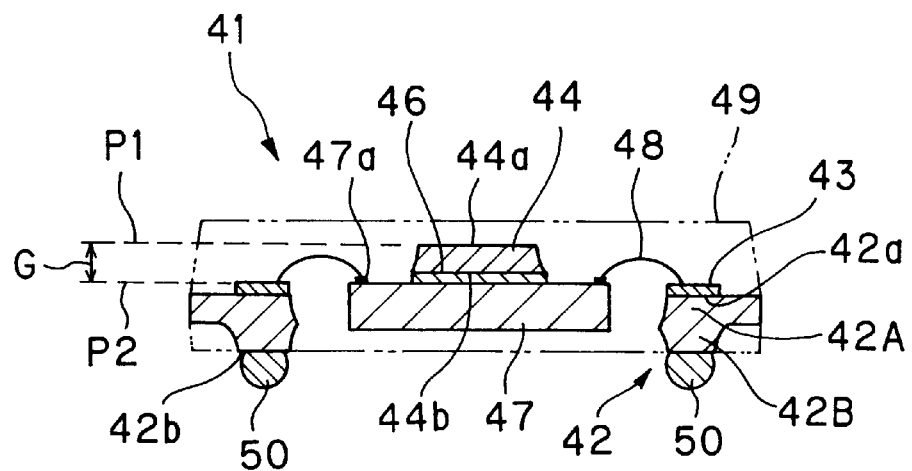
FIG. 11 is a sectional view diagrammatically showing another embodiment of the resin-sealed semiconductor device of the invention.
Figure 12:
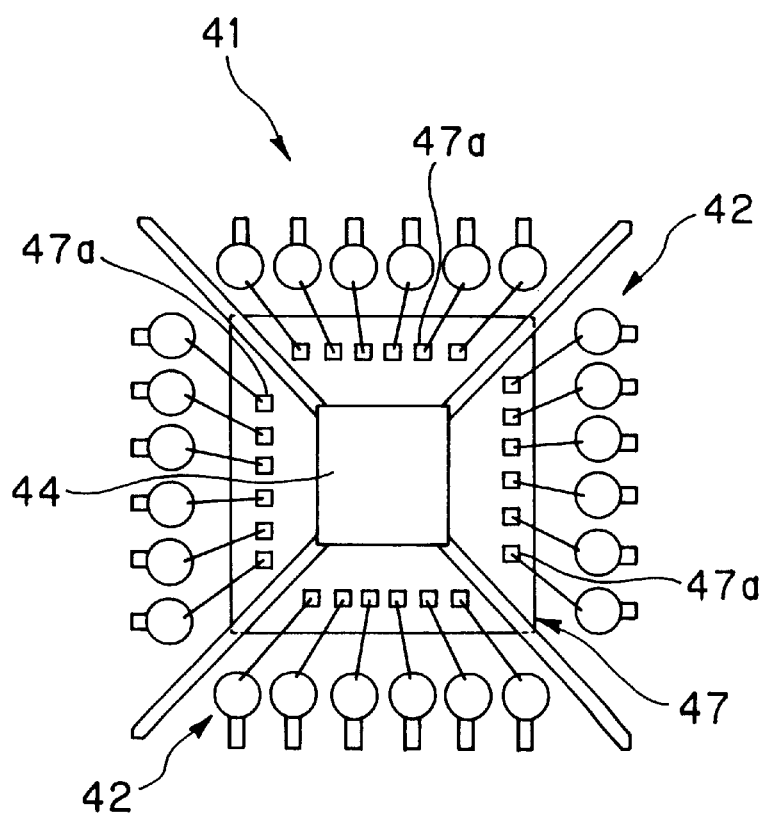
FIG. 12 is a plan view showing an inner constitution of the resin-sealed semiconductor device shown in FIG. 11.

FIG. 11 is a sectional view diagrammatically showing another embodiment of the resin-sealed semiconductor device of the invention, while FIG. 12 is a plan view showing an inner constitution of the resin-sealed semiconductor device shown in FIG. 11. Additionally, to facilitate the understanding of the constitution of the resin-sealed semiconductor device, a sealing member 49 is shown by an imaginary line (two-dot chain line) in FIG. 11.

In a resin-sealed semiconductor device 41 of the invention shown in FIGS. 11 and 12, plural terminal portions 42 are arranged electrically independent of one another two-dimensionally substantially in a plane. A die pad 44 is disposed in a substantially middle portion of the arranged terminal portions 42. The die pad 44 has a rectangular surface configuration. A face opposite to a terminal face of a semiconductor element 47 is fixed and mounted via an adhesive 46 onto a rear face 44b of the die pad 44.

The terminal portion 42 has an inner terminal 42A on a surface and an outer terminal 42B on a rear face with the inner and outer terminals being integrally formed. In FIGS. 11 and 12, an exposed surface 42a of each inner terminal 42A is positioned substantially on a plane. The exposed surface 42a is provided with a silver plating layer 43.

The die pad 44 is thinner than the terminal portion 42. There is provided a gap G between a surface 44a (shown by a dashed line P1 in FIG. 11) of the die pad 44 and a plane formed by the silver plating layer 43 on each inner terminal 42A (shown by a dashed line P2 in FIG. 11). Thereby, each terminal 47a of the semiconductor element 47 fixed on the rear face 44b of the die pad 44 is disposed on the substantially same plane as a plane formed by the inner terminal 42A of the terminal portion 42 (plane formed by the silver plating layer 43). Therefore, there is provided a large allowance in loop height of each wire 48 for connecting each terminal 47a of the semiconductor element 47 and each inner terminal 42A (silver plating layer 43) of the terminal portion 42.

The terminal portions 42, the die pad 44, the semiconductor element 47 and the wires 48 are sealed by the sealing member 49 in such a manner that the outer terminals 42B are partially exposed to the outside. For the sealing member 49, a known sealing resin material for use in the resin-sealed semiconductor device can be used. In the embodiment shown in FIG. 11, only the exposed outer terminals 42B are provided with outer electrodes 50 constituted of solder materials. In this manner, a BGA (ball grid array) semiconductor device is formed.

Figure 13:
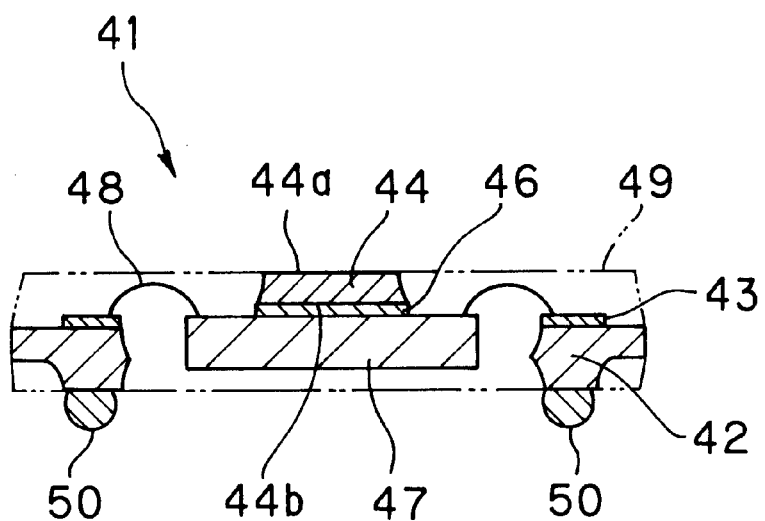
FIG. 13 is a sectional view diagrammatically showing another embodiment of the resin-sealed semiconductor device of the invention.

In the resin-sealed semiconductor device 41, the die pad 44 serves as a radiating plate of the semiconductor element 47. Specifically, when the semiconductor device 41 is mounted on the circuit substrate with the outer electrodes 50, heat generated in the semiconductor element 47 is conducted to the die pad 44 which has a high thermal conductivity. The heat is efficiently removed by a cooling air current which flows in an upper portion of the resin-sealed semiconductor device 41. Therefore, the resin-sealed semiconductor device 41 has a remarkably good radiation property. Also, in the invention, to enhance the radiation property of the resin-sealed semiconductor device 41, as shown in FIG. 13, the sealing member 49 may be provided in such a manner that the surface 44a of the die pad 44 is exposed to the outside.

Also in the resin-sealed semiconductor device 41, in the same manner as the resin-sealed semiconductor devices of the invention shown in FIGS. 1 to 10, when the terminal portions 42 and the die pad 44 are formed of a copper or a copper-base alloy, a nickel plating layer and a palladium plating layer may be laminated at least on the resin sealed region. Also, when the terminal portions 42 and the die pad 44 are formed not of the copper or copper-base alloy material but of Alloy 42 (41% Ni-iron) or another iron-base alloy material, the palladium plating layer may be formed directly on the iron-base alloy material.

Circuit Member

A circuit member of the invention will be described.

Figure 14:
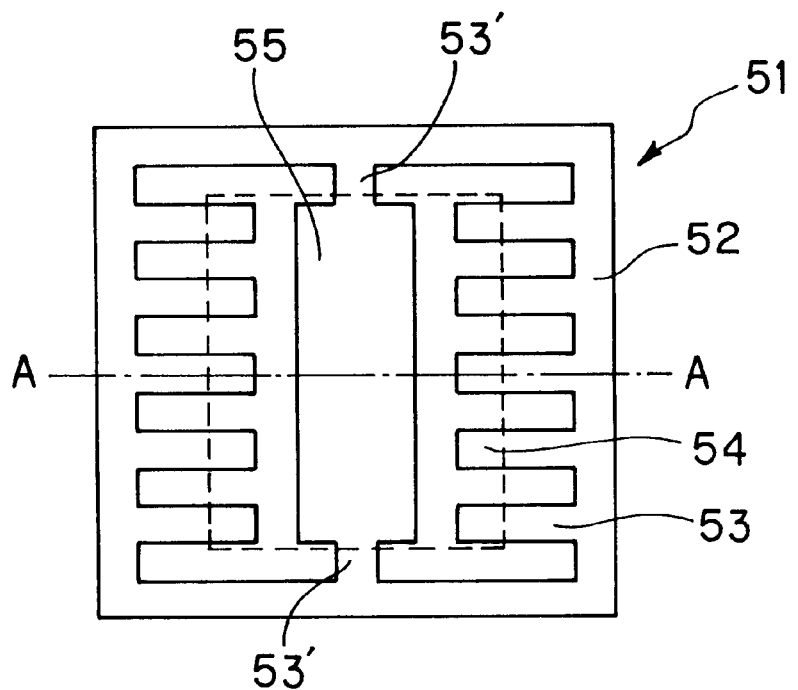
FIG. 14 is a plan view showing an embodiment of a circuit member of the invention.
Figure 15:
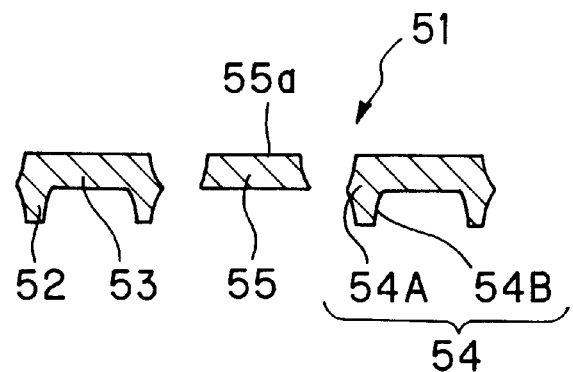
FIG. 15 is a vertical sectional view of the circuit member taken along line A—A in FIG. 14.

FIG. 14 is a plan view showing an embodiment of the circuit member of the invention, while FIG. 15 is a vertical sectional view of the circuit member taken along line A—A in FIG. 14. Additionally, a region surrounded by a chain line in FIG. 14 is a region of the circuit member for use in the manufacture of the semiconductor device.

In FIGS. 14 and 15, a circuit member 51 of the invention is provided with an outer frame member 52, plural terminal portions 54 independently connected via connection leads 53 from the outer frame member 52 and a die pad 55 connected via connecting leads 53' to the outer frame member 52.

The outer frame member 52 has rectangular contour and inner opening configurations. The connecting leads 53 are extended from a pair of opposite sides of the inner opening of the outer frame member 52 in the same plane. Also, the connecting leads 53' are extended from the other pair of opposite sides of the inner opening of the outer frame member 52 in the same plane.

The terminal portion 54 is connected to a tip end of the connecting lead 53, and has an inner terminal 54A on a surface and an outer terminal 54B on a rear face with the inner and outer terminals being integrally formed.

The die pad 55 is supported by the two connecting leads 53' which are extended from the pair of opposite sides of the inner opening of the outer frame member 52 in the same plane. The die pad 55 is thinner than the terminal portion 54. A surface 55a of the die pad 55 is in the same plane as a plane formed by each inner terminal 54A, and a rear face 55b thereof is positioned inside a plane formed by the outer terminal 54B.

Figure 16:
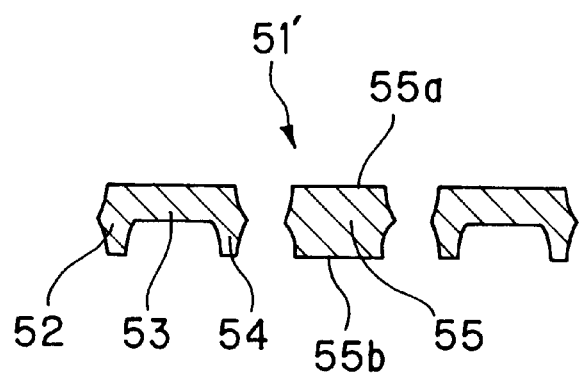
FIGS. 16 and 17 are sectional views showing other embodiments of the circuit member of the invention.

Alternatively, in a circuit member 51' of the invention shown in FIG. 16, the die pad 55 is as thick as the terminal portion 54. The surface 55a of the die pad 55 is in the same plane as a plane formed by each inner terminal 54A, while the rear face 55b thereof may be in the same plane as the plane formed by the outer terminal 54B.

Figure 17:
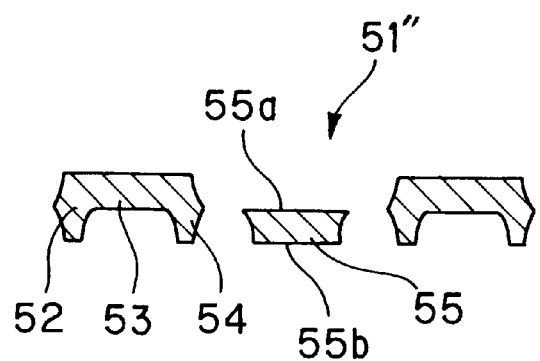

Further, in a circuit member 51" of the invention shown in FIG. 17, the die pad 55 is thinner than the terminal portion 54. The surface 55a of the die pad 55 is positioned inside the plane formed by the inner terminal 54A, while the rear face 55b thereof is in the same plane as the plane formed by the outer terminal 54B.

The circuit member 51, 51' or 51" may be formed of Alloy 42 (41% Ni—Fe), a copper, a copper-base alloy or the like.

Additionally, when the circuit member 51, 51' or 51" of the invention is formed of a copper or a copper-base alloy, a nickel plating layer and a palladium plating layer may be laminated at least on the resin sealed region during the manufacture of the semiconductor device, as described above in the resin-sealed semiconductor device of the invention shown in FIGS. 1 to 10. Also, when the circuit member 51, 51' or 51" is formed not of the copper or copper-base alloy material but of Alloy 42 (41% Ni—Fe) or another iron-base alloy material, the palladium plating layer may be formed directly on the iron-base alloy material.

Also, in the circuit member 51, 51' or 51" of the invention, an insulating adhesive double-coated tape may be provided on the surface 55a of the die pad 55. As the adhesive double-coated tape available is an adhesive double-coated tape of an insulating base film having adhesive layers formed on both faces thereof, for example, an adhesive double-coated tape UX1W (manufactured by Kabushiki Kaisha Tomoegawa Seishisho) of UPLEX (insulating base film manufactured by Ube Kosan Kabushiki Kaisha) having RXF (adhesive manufactured by Kabushiki Kaisha Tomoegawa Seishisho) layers on both faces thereof.

When the circuit member 51 is used in a method of manufacturing the resin-sealed semiconductor device of the invention as described later, the resin-sealed semiconductor device 1 or 1' can be manufactured. Also, when the circuit member 51' is used in the method of manufacturing the resin-sealed semiconductor device of the invention as described later, the resin-sealed semiconductor device 11 or 11' can be manufactured. Further, when the circuit member 51" is used in the method of manufacturing the resin-sealed semiconductor device of the invention as described later, the resin-sealed semiconductor device 21 or 21' can be manufactured.

Additionally, the number and arrangement of the terminals in the circuit member are only illustrated in the above. The invention is not limited to these.

Figure 18:
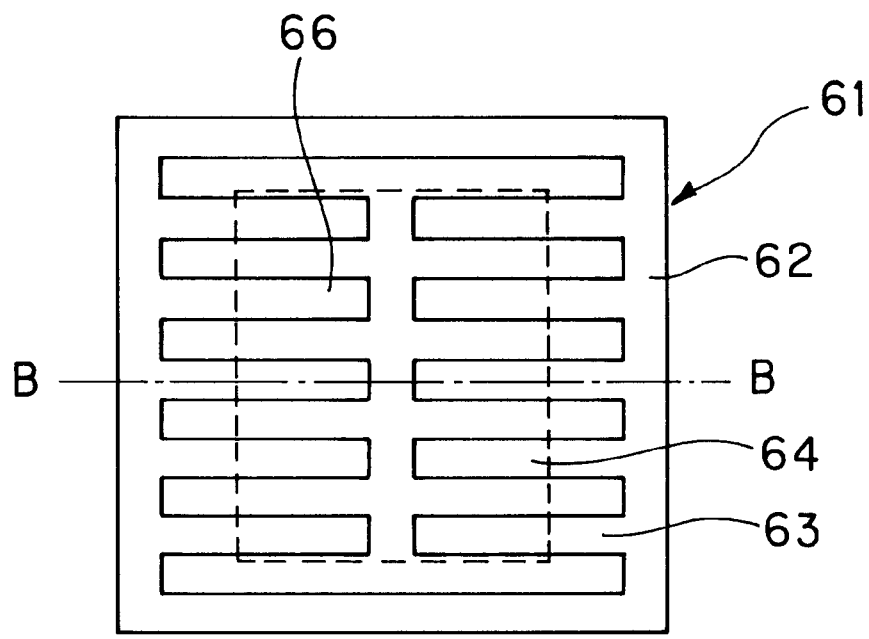
FIG. 18 is a plan view showing another embodiment of the circuit member of the invention.
Figure 19:
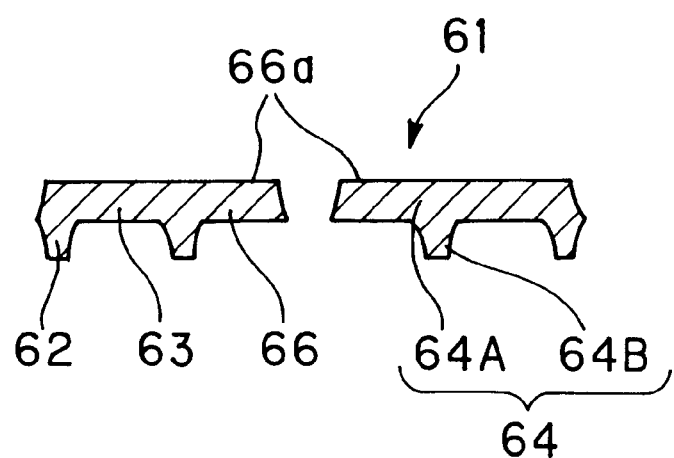
FIG. 19 is a vertical sectional view of the circuit member taken along line B—B in FIG. 18.

FIG. 18 is a plan view showing another embodiment of the circuit member of the invention, while FIG. 19 is a vertical sectional view of the circuit member taken along line B—B in FIG. 18. Additionally, a region surrounded by a chain line in FIG. 18 is a region of the circuit member for use in the manufacture of the semiconductor device.

In FIGS. 18 and 19, a circuit member 61 of the invention is provided with an outer frame member 62, plural terminal portions 64 independently connected via connection leads 63 from the outer frame member 62 and leads 66 integrally interconnected with the terminal portions 64 for mounting a semiconductor element thereon.

The outer frame member 62 has rectangular contour and inner opening configurations. The connecting leads 63 are extended from a pair of opposite sides of the inner opening of the outer frame member 62 into the same plane.

The terminal portion 64 has an inner terminal 64A on a surface and an outer terminal 64B on a rear face with the inner and outer terminals being integrally formed.

The leads 66 are integrally interconnected with tip ends of the terminal portions 64, and positioned in the same plane as a plane formed by the terminal portions 64.

The circuit member 61 may be formed of Alloy 42 (41% Ni—Fe), a copper, a copper-base alloy or the like. Also, in the same manner as the circuit member 51, 51' or 51", when the circuit member 61 is formed of a copper or a copper-base alloy, a nickel plating layer and a palladium plating layer may be laminated at least on the resin sealed region during the manufacture of the semiconductor device. Also, when the circuit member 61 is formed not of the copper or copper-base alloy material but of Alloy 42 (41% Ni—Fe) or another iron-base alloy material, the palladium plating layer may be formed directly on the iron-base alloy material.

Also, in the circuit member 61 of the invention, an insulating adhesive double-coated tape may be provided on a surface 66a of the lead 66.

When the circuit member 61 is used in a method of manufacturing the resin-sealed semiconductor device of the invention as described later, the resin-sealed semiconductor device 31 or 31' can be manufactured.

FIGS. 20 to 22 are process diagrams showing an example of manufacturing the circuit member 51, 51' or 51".

Figure 20A:
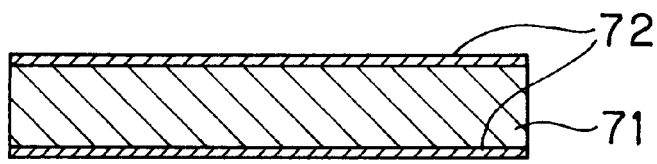
FIGS. 20A, 20B, 20C, 20D, 20E, 21A, 21B, 21C, 21D, 21E, 22A, 22B, 22C, 22D, 22E, 23A, 23B, 23C, 23D, 23E are process diagrams showing examples of manufacturing the circuit member of the invention.
Figure 20B:
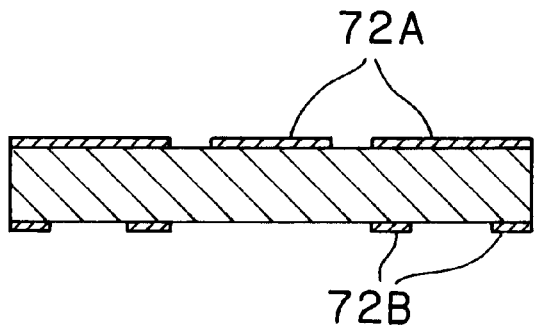
Figure 21A:
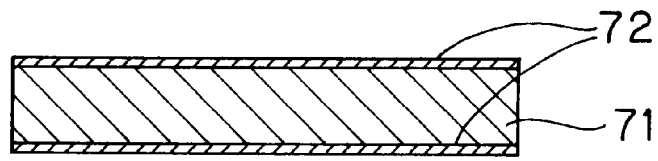
Figure 21B:
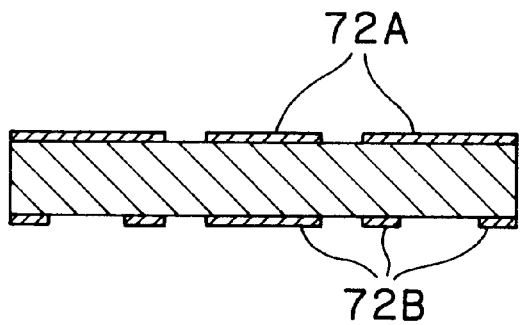
Figure 22A:
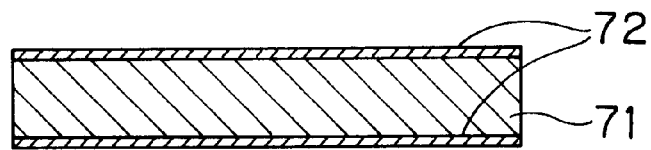
Figure 22B:
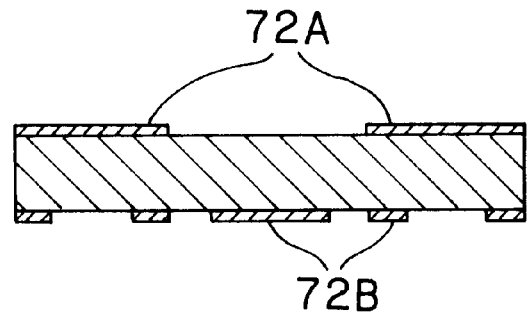

First, a photosensitive resist is applied onto a surface and a rear face of a substrate 71 and dried to form photosensitive resist layers 72 (FIGS. 20A, 21A, 22A). After the photosensitive resist layers 72 are exposed via desired photo masks, images are developed to form resist patterns 72A and 72B (FIGS. 20B, 21B, 22B). For the substrate 71, as aforementioned, Alloy 42 (41% Ni—Fe), copper, copper-base alloy or another metal substrate with a thickness of 100 to 250 µm can be used. The substrate 71 with both faces degreased or cleaned beforehand is preferably used. In accordance with the material of the substrate, as aforementioned, a palladium plating layer or a combination of a nickel plating layer and a palladium plating layer may be laminated on the substrate.

As the photosensitive resist, a conventional known resist can be used such as a casein resist using a photosensitive material of potassium dichromate, a negative liquefied resist (PMER-N) manufactured by Tokyo Ouka Kogyo Kabushiki Kaisha and the like.

Figure 20C:
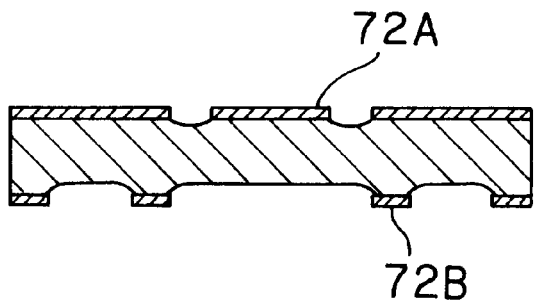
Figure 20D:
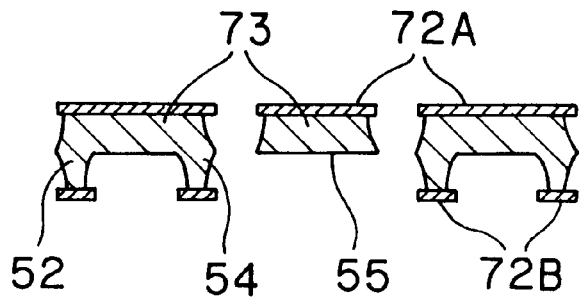
Figure 21C:
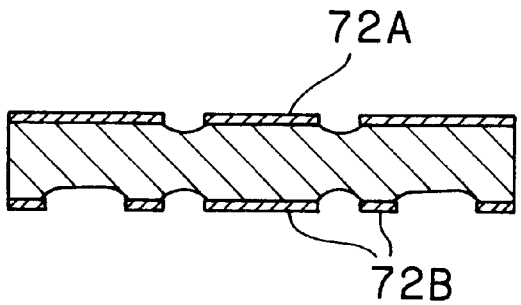
Figure 21D:
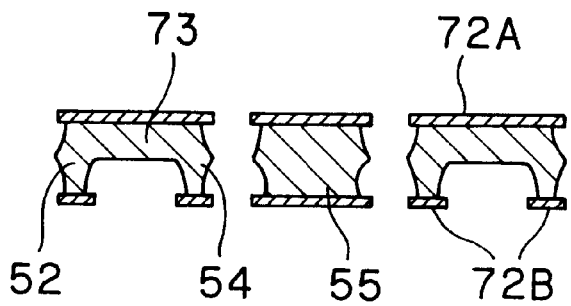
Figure 22C:
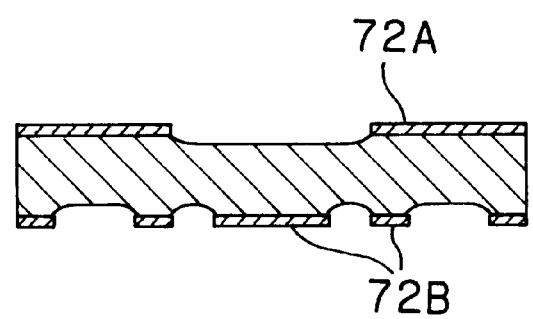
Figure 22D:
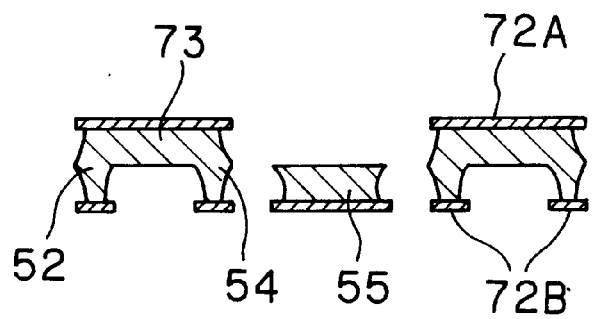

Subsequently, by using the resist patterns 72A and 72B as etching resistant films, the substrate 71 is etched with an etching liquid. The etching proceeds as shown in FIGS. 20C, 21C or 22C, and completes as shown in FIGS. 20D, 21D or 22D.

As the etching liquid, an aqueous ferric chloride solution is usually used. The etching liquid is applied to both faces of the substrate 71 through spray etching. By adjusting an etched quantity in the etching process, a thickness of a small thickness portion 73 can be adjusted.

Figure 20E:
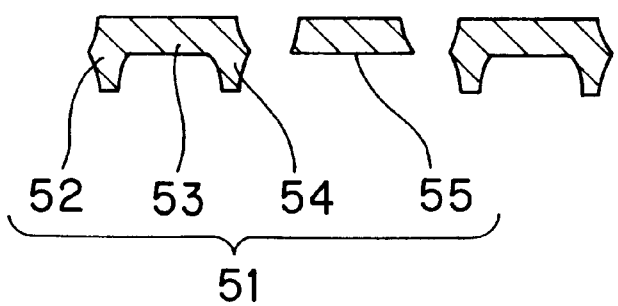
Figure 21E:
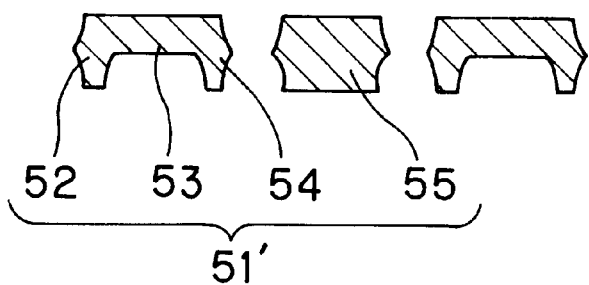
Figure 22E:
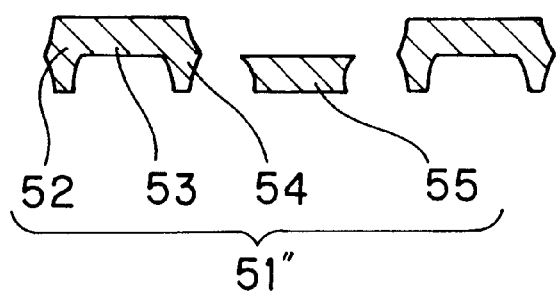

Subsequently, the resist patterns 72A and 72B are peeled and removed to obtain the circuit member 51, 51' or 51" of the invention (FIGS. 20E, 21E, 22E).

Also, FIG. 23 is a process diagram showing an example of manufacturing the circuit member 61.

Figure 23A:
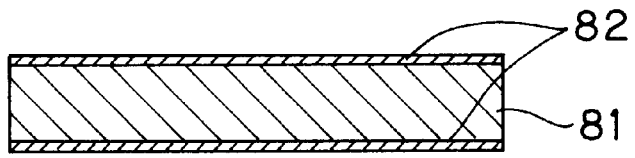
Figure 23B:
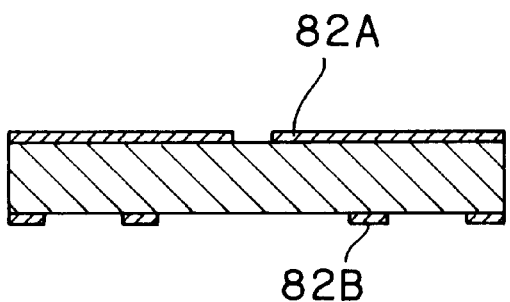

First, a photosensitive resist is applied onto a surface and a rear face of a substrate 81 and dried to form photosensitive resist layers 82 (FIG. 23A). After the photosensitive resist layers 82 are exposed via desired photo masks, images are developed to form resist patterns 82A and 82B (FIG. 23B). For the substrate 81, the same as the substrate 71 can be used.

Figure 23C:
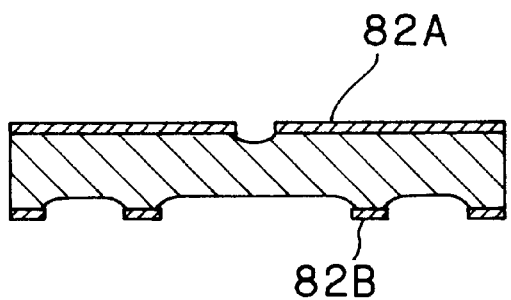
Figure 23D:
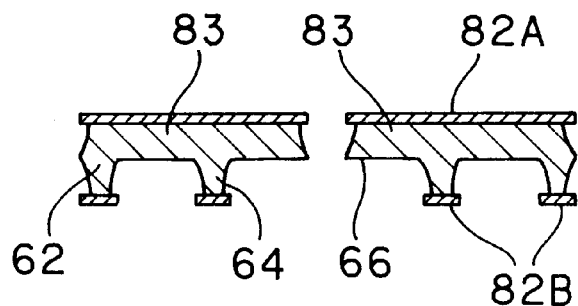

Subsequently, by using the resist patterns 82A and 82B as etching resistant films, the substrate 81 is etched with an etching liquid. The etching proceeds as shown in FIG. 23C, and completes as shown in FIG. 23D. As the etching liquid, an aqueous ferric chloride solution is usually used. The etching liquid is applied to both faces of the substrate 81 through spray etching. By adjusting an etched quantity in the etching process, a thickness of a small thickness portion 83 can be adjusted.

Figure 23E:
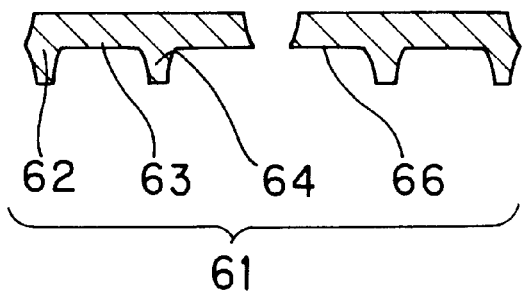

Subsequently, the resist patterns 82A and 82B are peeled and removed to obtain the circuit member 61 of the invention (FIG. 23E).

Figure 24:
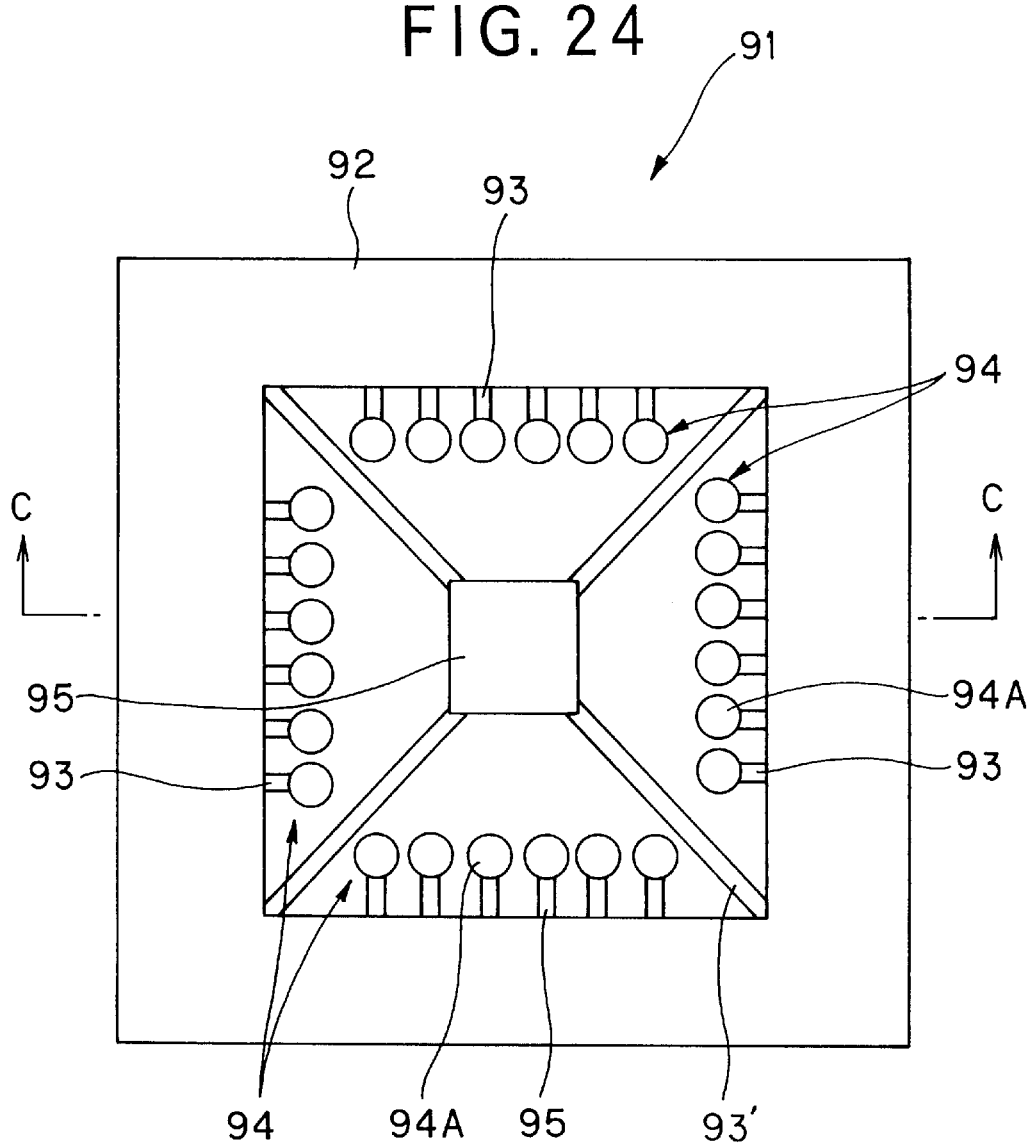
FIG. 24 is a plan view showing another embodiment of the circuit member of the invention.
Figure 25:
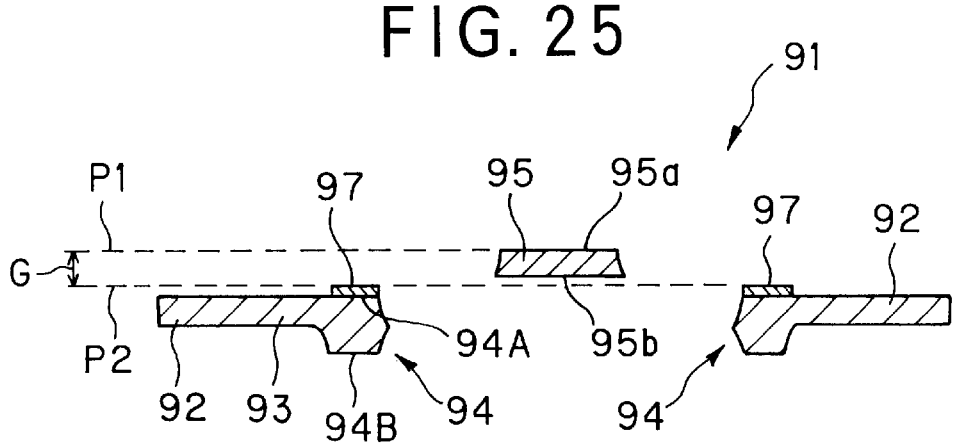
FIG. 25 is a vertical sectional view of the circuit member taken along line C—C in FIG. 24.

FIG. 24 is a plan view showing another embodiment of the circuit member of the invention, while FIG. 25 is a vertical sectional view of the circuit member taken along line C—C in FIG. 24. In FIGS. 24 and 25, a circuit member 91 of the invention is provided with an outer frame member 92, plural terminal portions 94 independently connected via connection leads 93 from the outer frame member 92 and a die pad 95 connected via connection leads 93' from the outer frame member 92.

The outer frame member 92 has rectangular contour and inner opening configurations. The connecting leads 93 are extended from sides of the inner opening of the outer frame member 92 in the same plane.

The terminal portion 94 is provided on a tip end of the connection lead 93, and has an inner terminal 94A on a surface and an outer terminal 94B on a rear face with the inner and outer terminals being integrally formed. As shown in FIG. 25, the inner terminal 94A is provided with a silver plating layer 97. The silver plating layer 97 on the inner terminal 94A is positioned on the same plane (plane shown by a dashed line P2 in FIG. 25).

The die pad 95 is supported by the four connecting leads 93' which are extended from corners of the inner opening of the outer frame member 92. Then, the die pad 95 is protruded above the inner terminal 94A (upward in FIG. 25). In the constitution, a gap G is formed between a plane formed by a surface 95a (shown by a dashed line PI in FIG. 25) of the die pad 95 and the silver plating layer 97 on each inner terminal 94A. A size of the gap G can be set, for example, in a range of about 100 to 500 µm.

The circuit member 91 may be formed of Alloy 42 (41% Ni—Fe), a copper, a copper-base alloy or the like. Also, when the circuit member 91 of the invention is formed of a copper or a copper-base alloy, a nickel plating layer and a palladium plating layer may be laminated at least on the resin sealed region during the manufacture of the semiconductor device in the same manner as in the resin-sealed semiconductor devices of the invention shown in FIGS. 1 to 10. When the circuit member 91 of the invention is formed not of the copper or copper-base alloy material but of Alloy 42 (41% Ni—Fe) or another iron-base alloy material, the palladium plating layer may be formed directly on the iron-base alloy material.

Also, in the circuit member 91 of the invention, an insulating adhesive double-coated tape may be provided on a rear face 95b of the die pad 95.

FIG. 26 is a process diagram showing an example of manufacturing the circuit member 91 of the invention shown in FIGS. 24 and 25. Each process is shown in a vertical sectional view of the circuit member corresponding to FIG. 25.

In FIG. 26, first a photosensitive resist is applied onto a surface and a rear face of a substrate 101 and dried. After exposure is performed via desired photo masks, images are developed to form resist patterns 102A and 102B (FIG. 26A). For the substrate 101, the same as the substrate 71 can be used. Also as the photosensitive resist, a conventional known resist can be used.

Figure 26A:
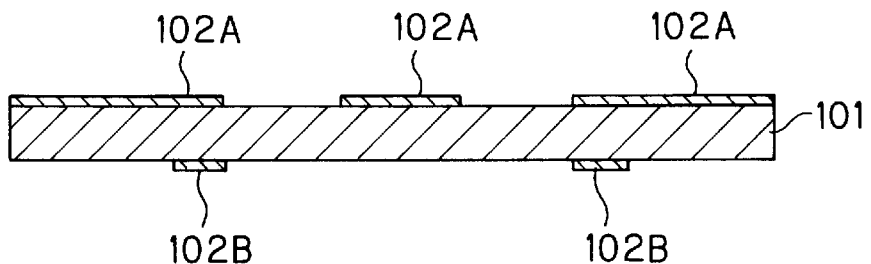
FIGS. 26A, 26B, 26C, 26D is a process diagram showing an example of manufacturing the circuit member of the invention shown in FIGS. 24 and 25.
Figure 26B:
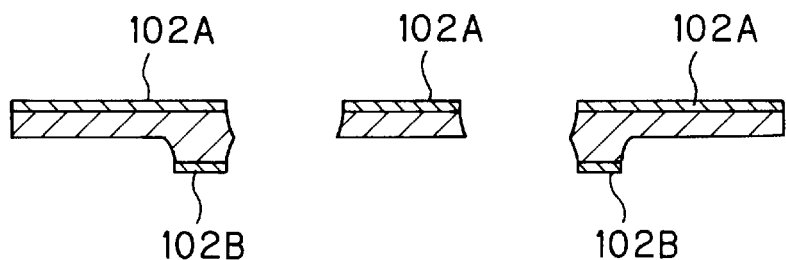

Subsequently, by using the resist patterns 102A and 102B as etching resistant films, the substrate 101 is etched with an etching liquid (FIG. 26B). As the etching liquid, an aqueous ferric chloride solution is usually used. The etching liquid is applied to both faces of the substrate 101 through spray etching.

Figure 26C:
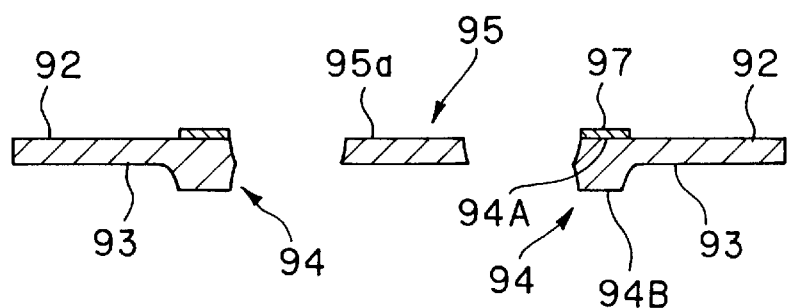

Subsequently, the resist patterns 102A and 102B are peeled and removed to obtain a circuit member pattern in which the terminal portions 94 and the die pad 95 are integrally interconnected via connection leads 3 and 3' (not shown) to the outer frame member 92 (FIG. 26C). As clearly seen from FIG. 26C, in the circuit member pattern, the inner terminal 94A and the surface 95a of the die pad 95 are positioned in the same plane.

Figure 26D:
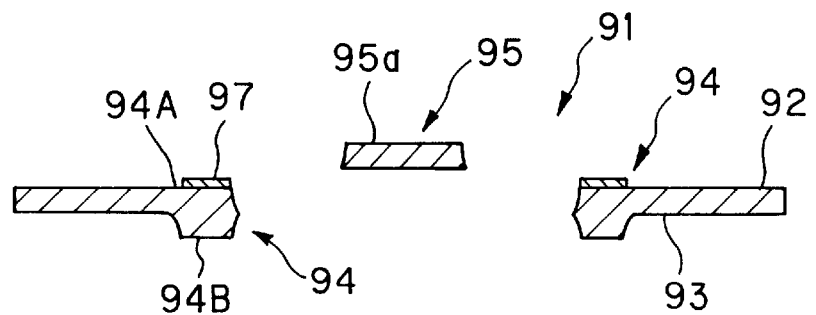

Subsequently, after forming the silver plating layer 97 on the inner terminal 94A of the terminal portion 94, the die pad 95 is protruded from the inner terminal 94A by using a predetermined metal mold. A gap is formed between the surface 95a of the die pad 95 and the surface of the inner terminal 94A (FIG. 26D). Consequently, the circuit member 91 of the invention can be obtained.

Manufacture Method of Resin-Sealed Semiconductor Device

A method of manufacturing the resin-sealed semiconductor device of the invention will be described.

First, an example of a method for manufacturing the resin-sealed semiconductor device 1 of the invention shown in FIGS. 1 and 2 will be described.

FIG. 27 is a process diagram showing an embodiment of the manufacture method of the resin-sealed semiconductor device according to the invention. Each process is shown in a constitutional diagram of the resin-sealed semiconductor device corresponding to FIG. 1.

Figure 27A:
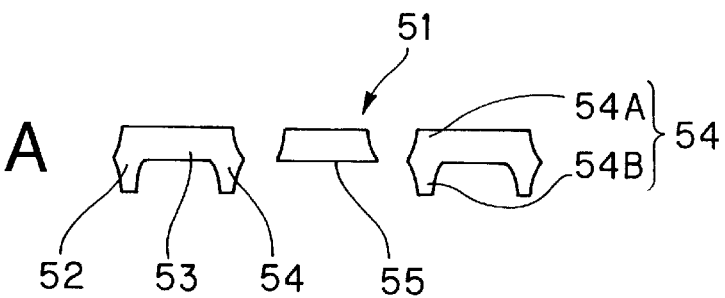
FIGS. 27A, 27B, 27C, 27D, 27E is a process diagram showing an example of a method of manufacturing the resin-sealed semiconductor device of the invention.
Figure 27B:
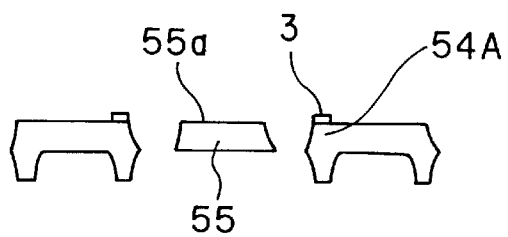

First, by carrying out the process shown in FIG. 20, the circuit member 51 shown in FIGS. 14 and 15 is prepared (FIG. 27A). Subsequently, after cleaning the circuit member 51, the silver plating layer 3 is formed on the surface of the inner terminal 54A (FIG. 27B). Additionally, instead of the silver plating layer 3, a gold plating layer, a palladium plating layer or the like may be formed.

Figure 27C:
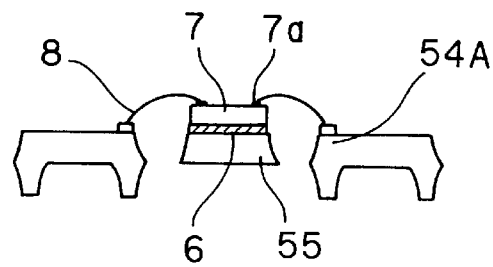

Subsequently, the face opposite to the terminal face of the semiconductor element 7 is fixed via the insulating adhesive material 6 onto the surface 55a of the die pad 55. The semiconductor element 7 is thus mounted. Then, the terminals 7a of the mounted semiconductor element 7 are electrically connected via the wires 8 to the silver plating layers 3 on the inner terminals 54A of the terminal portions 54 in the circuit member 51 (FIG. 27C).

Figure 27D:
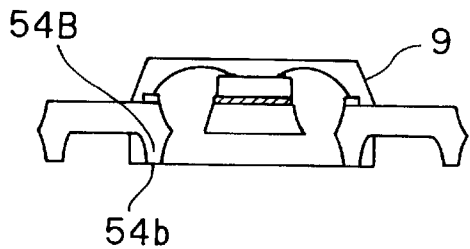

Subsequently, the terminal portions 54, the die pad 55, the semiconductor element 7 and the wires 8 are sealed in the sealing member 9 in such a manner that the portions (54b) of the outer terminals 54B are exposed to the outside (FIG. 27D).

Figure 27E:
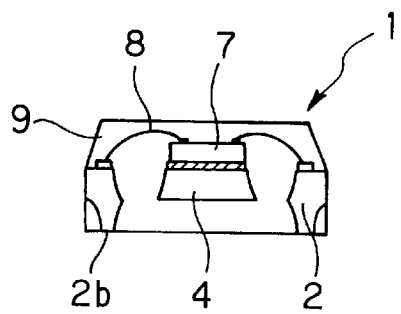

Subsequently, by cutting the connection leads 53 of the circuit member 51, the outer frame member 52 is removed to obtain the resin-sealed semiconductor device 1 of the invention shown in FIGS. 1 and 2 (FIG. 27E).

Additionally, after the sealing in the sealing member 9, the outer electrodes of solder materials are formed on the exposed outer terminals 54b. Then, the resin-sealed semiconductor device 1' of the invention shown in FIG. 3 can be obtained. The outer electrodes of solder materials can be formed by applying a solder paste through screen printing, reflowing or the like. Only a quantity of solder necessary for connecting the circuit substrate and the resin-sealed semiconductor device may be obtained.

As another method of manufacturing the resin-sealed semiconductor device of the invention, an example of a method for manufacturing the resin-sealed semiconductor device 31 shown in FIGS. 8 and 9 will be described.

FIG. 28 is a process diagram showing another embodiment of the manufacture method of the resin-sealed semiconductor device according to the invention. Each process is shown in a constitutional diagram of the resin-sealed semiconductor device corresponding to FIG. 8.

Figure 28A:
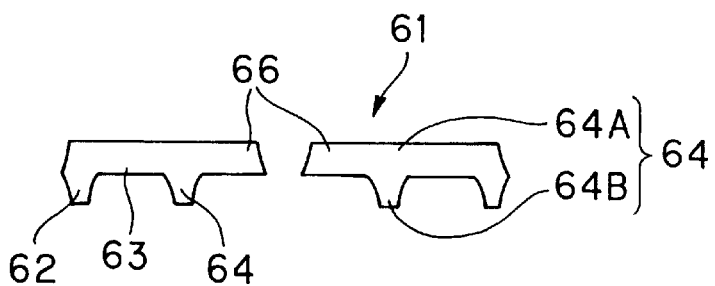
Figure 28B:
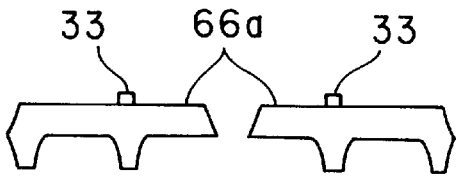

First, by carrying out the process shown in FIG. 23, the circuit member 61 shown in FIGS. 18 and 19 is prepared (FIG. 28A). Subsequently, after cleaning the circuit member 61, the silver plating layer 33 is formed on the surface of the inner terminal 64A (FIG. 28B). Additionally, instead of the silver plating layer 33, a gold plating layer, a palladium plating layer or the like may be formed.

Figure 28C:
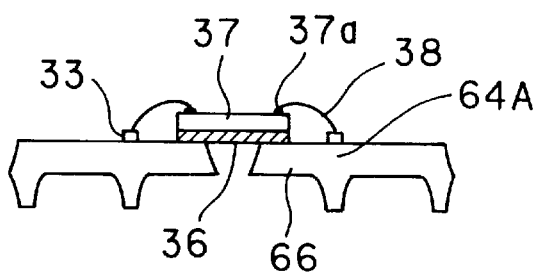

Subsequently, the face opposite to the terminal face of the semiconductor element 37 is fixed via the insulating adhesive material 36 onto the surfaces 66a of the leads 66. The semiconductor element 37 is thus mounted. Then, the terminals 37a of the mounted semiconductor element 37 are electrically connected via the wires 38 to the silver plating layers 33 on the inner terminals 64A of the terminal portions 64 in the circuit member 61 (FIG. 28C).

Figure 28D:
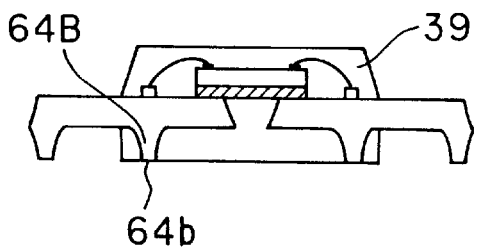

Subsequently, the terminal portions 64, the leads 66, the semiconductor element 37 and the wires 38 are sealed in the sealing member 39 in such a manner that the portions (64b) of the outer terminals 64B are exposed to the outside (FIG. 28D).

Figure 28E:
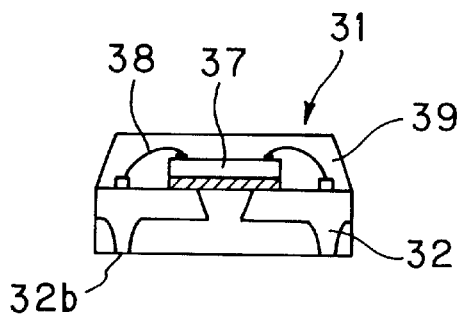

Subsequently, by cutting the connection leads 63 of the circuit member 61, the outer frame member 62 is removed to obtain the resin-sealed semiconductor device 31 of the invention shown in FIGS. 8 and 9 (FIG. 28E).

Additionally, after the sealing in the sealing member 39, the outer electrodes of solder materials are formed on the exposed outer terminals 64b. Then, the resin-sealed semiconductor device 31' of the invention shown in FIG. 10 can be obtained. The outer electrodes of solder materials can be formed by applying a solder paste through screen printing, reflowing or the like. Only a quantity of solder necessary for connecting the circuit substrate and the resin-sealed semiconductor device may be used.

In the description of the method of manufacturing the resin-sealed semiconductor device of the invention, the circuit member 51 shown in FIG. 14 and 15 and the circuit member 61 shown in FIGS. 18 and 19 are used. Needless to say, in the method of manufacturing the resin-sealed semiconductor device according to the invention, any circuit member of the invention can be used.

EXAMPLES

Concrete examples of the invention will be given below to describe the invention in more detail.

Example 1

By using a substrate of Alloy 42 (41% Ni—Fe), a circuit member of the invention was prepared in the etching method shown in FIG. 20. Specifically, after degreasing or cleaning the substrate, an ultraviolet hardening resist (PMER-N manufactured by Tokyo Ouka Kogyo Kabushiki Kaisha) was applied to both faces of the substrate through a flowing method and dried. Subsequently, resist layers on the surface and the rear face of the substrate were exposed via predetermined photo masks to develop images and form resist patterns. Thereafter, both the faces of the substrate were spray-etched by using an aqueous ferric chloride solution. After cleaning, the resist patterns were peeled and removed by using an organic alkaline solution. A terminal portion of the circuit member was 0.2 mm thick, while a connection lead portion was 0.05 mm thick.

Subsequently, a silver plating layer was formed on an inner terminal face of the prepared circuit member. Thereafter, an insulating adhesive double-coated tape (UH1W manufactured by Tomoegawa Seishisho Kabushiki Kaisha) was placed on a surface of a die pad. Subsequently, a face opposite to a terminal face of a semiconductor element (about 0.25 mm thick) was pressed onto the adhesive double-coated tape, heated (140° C.) and fixed thereto. The semiconductor element was thus mounted. Subsequently, the silver plating layers on the inner terminals of the circuit member were connected via gold wires to terminals of the mounted semiconductor element. Thereafter, the terminal portions, the die pad, the semiconductor element and the gold wires were sealed in a resin material (MP-7400 manufactured by Nitto Denko Iabushiki Kaisha) in such a manner that outer terminals were partially exposed to the outside.

Subsequently, by cutting connection leads of the circuit member, an outer frame member was removed. Solder balls were bonded to the exposed outer terminals to form outer electrodes.

A resin-sealed semiconductor device prepared in this manner had no problem about its quality.

Example 2

A resin-sealed semiconductor device was prepared in the same manner as the first example except in that instead of the Alloy 42 (41% Ni—Fe), a copper plate (EFTEC64T-½H manufactured by Furukawa Denki Kogyo Kabushiki Kaisha) was used.

The resin-sealed semiconductor device prepared in this manner had no problem about its quality.

Example 3

By using a substrate of Alloy 42 (41% Ni—Fe), a circuit member of the invention was prepared in the etching method shown in FIG. 23. Specifically, after degreasing or cleaning the substrate, an ultraviolet hardening resist (PMER-N manufactured by Tokyo Ouka Kogyo Kabushiki Kaisha) was applied to both faces of the substrate through a flowing method and dried. Subsequently, resist layers on the surface and the rear face of the substrate were exposed via predetermined photo masks to develop images and form resist patterns. Thereafter, both the faces of the substrate were spray-etched by using an aqueous ferric chloride solution. After cleaning, the resist patterns were peeled and removed by using an organic alkaline solution. A terminal portion of the circuit member was 0.2 mm thick, while a connection lead portion or a lead was 0.05 mm thick.

Subsequently, a silver plating layer was formed on an inner terminal face of the prepared circuit member. Thereafter, an insulating adhesive double-coated tape (UH1W manufactured by Tomoegawa Seishisho Kabushiki Kaisha) was placed on a surface of the lead. Subsequently, a face opposite to a terminal face of a semiconductor element (about 0.25 mm thick) was pressed onto the adhesive double-coated tape, heated (140° C.) and fixed thereto. The semiconductor element was thus mounted. Subsequently, the silver plating layers on the inner terminals of the circuit member were connected via gold wires to terminals of the mounted semiconductor element. Thereafter, the terminal portions, the leads, the semiconductor element and the gold wires were sealed in a resin material (MP-7400 manufactured by Nitto Denko Kabushiki Kaisha) in such a manner that outer terminals were partially exposed to the outside.

Subsequently, by cutting connection leads of the circuit member, an outer frame member was removed. Solder balls were bonded to the exposed outer terminals to form outer electrodes.

A resin-sealed semiconductor device prepared in this manner had no problem about its quality.

Example 4

A circuit member was prepared in the same manner as the first example except in that instead of the Alloy 42 (41% Ni—Fe), a copper plate (EFTEC64T-½H manufactured by Furukawa Denki Kogyo Kabushiki Kaisha) was used. A terminal portion was 0.2 mm thick, and a connection lead portion was 0.1 mm thick.

Subsequently, by using a micro-etching process liquid (CZ8100) manufactured by MEC Kabushiki Kaisha, the circuit member was subjected to a surface roughing process. Through the surface roughing process, the entire surface of the circuit member had a center line average roughness Ra of 0.2 $\mu$m according to JIS B0601.

Subsequently, by using a nickel plating bath (WHN manufactured by Kojyundo Kagaku Kabushiki Kaisha), a nickel plating layer (1 $\mu$m thick) was formed on the circuit member. The center line average roughness Ra of JIS B0601 of the nickel plating layer was 0.050 $\mu$m.

Subsequently, on the nickel plating layer formed as a palladium plating layer (0.1 $\mu$m thick).

By using the circuit member, a resin-sealed semiconductor device was prepared in the same manner as the first example.

The resin-sealed semiconductor device prepared in this manner had no problem about its quality.

Example 5

By using a 0.15 mm thick copper plate (EFTEC64T-½H manufactured by Furukawa Denki Kogyo Kabushiki Kaisha) as a conductive substrate, a circuit member of the invention was prepared in the etching method shown in FIG. 26. Specifically, after degreasing or cleaning the copper plate, an ultraviolet hardening resist (PMER-N manufactured by Tokyo Ouka Kogyo Kabushiki Kaisha) was applied to both faces of the copper plate through a flowing method and dried. Subsequently, resist layers on the surface and the rear face were exposed via predetermined photo masks to develop images and form resist patterns. Thereafter, both the faces of the copper plate were spray-etched by using an aqueous ferric chloride solution. After cleaning, the resist patterns were peeled and removed by using an organic alkaline solution.

Subsequently, after a silver plating layer (about 5 $\mu$m thick) was formed on an inner terminal face, a die pad was protruded from the inner terminal face by using a predetermined metallic mold. Thereby, a gap of about 250 $\mu$m was formed between the surface of the die pad and the silver plating layer on the inner terminal. Thereafter, an insulating adhesive double-coated tape (UH1W manufactured by Tomoegawa Seishisho Kabushiki Kaisha) was placed on a rear face of the die pad to obtain the circuit member.

A terminal face of a semiconductor element (about 0.25 mm thick) was pressed onto the adhesive double-coated tape on the rear face of the die pad of the circuit member, heated (140° C.) and fixed thereto. The semiconductor element was thus mounted. Subsequently, the silver plating layers on the inner terminals of the circuit member were connected via gold wires to terminals of the mounted semiconductor element. Thereafter, the terminal portions, the die pad, the semiconductor element and the gold wires were sealed in a resin material (MP-7400 manufactured by Nitto Denko Kabushiki Kaisha) in such a manner that outer terminals were partially exposed to the outside.

Subsequently, by cutting connection leads of the circuit member, an outer frame member was removed. Solder balls were bonded to the exposed outer terminals to form outer electrodes.

The number of the outer terminals in a semiconductor device prepared in this manner was 80 pins. A contour dimension was 10 mm sides. Specifically, the semiconductor device was compact-sized. Additionally, a thickness was 0.8 mm. The semiconductor device was also very thin.

What is claimed is:

1. A semiconductor device, comprising:

a semiconductor element;

a plurality of terminals aligned with each other, electrically connected to said semiconductor element, and having a top surface defining a plane;

a die pad fixed to said semiconductor element, electrically independent from said terminals, and having a top surface in said plane; and a resin configured to completely seal said semiconductor element and said die pad, wherein each of said terminals comprises at least one portion embedded in said resin, and further comprises a bottom surface flush with an outer surface of said resin and exposed to the outside of said resin.

2. A semiconductor device according to claim 1, further comprising an outer electrode formed on said bottom surface of each of said terminals, wherein said outer electrode comprises solder.

3. A semiconductor device according to claim 1, wherein said die pad and said terminals comprise a copper-base alloy.

4. A semiconductor device according to claim 3, wherein said die pad and said terminals further comprise a lamination of a nickel plating layer and a palladium plating layer laminated on said copper-base alloy.

5. A semiconductor device according to claim 4, wherein said copper-base alloy has a roughed surface and said nickel plating layer has a roughed surface.

6. A semiconductor device according to claim 5, wherein said roughed surface of said copper-base alloy has a center line average roughness of 0.1 $\mu$m or more and said roughed surface of said nickel plating layer has a center line average roughness of 0.045 $\mu$m or more.

7. A semiconductor device according to claim 1, wherein said die pad and said terminals comprise an iron-base alloy.

8. A semiconductor device according to claim 7, wherein said die pad and said terminals further comprise a palladium plating layer formed on said iron-base alloy.

9. A semiconductor device according to claim 8, wherein said iron-base alloy has a roughed surface.

10. A semiconductor device according to claim 9, wherein said roughed surface of said iron-base alloy has a center line average roughness of 0.1 $\mu$m or more.

11. A semiconductor device, comprising:

a semiconductor element having a top surface defining a plane;

a plurality of terminals aligned with each other;

a plating layer formed on each of said terminals, electrically connected to said semiconductor element, and leveled with said plane defined by said top surface of said semiconductor element;

a die pad fixed to said semiconductor element and electrically independent from said terminals; and a resin configured to embed said semiconductor element, at least one portion of said die pad, and at least one portion of each of said terminals, wherein each of said terminals comprises a bottom surface flush with an outer surface of said resin and exposed to the outside of said resin.

12. A semiconductor device according to claim 11, wherein said die pad comprises an unsealed portion exposed to the outside of said resin.

13. A semiconductor device according to claim 11, further comprising an outer electrode formed on said bottom surface of each of said terminals, wherein said outer electrode comprises solder.

14. A semiconductor device according to claim 11, wherein said die pad and said terminals comprise a copper-base alloy.

15. A semiconductor device according to claim 14, wherein said die pad and said terminals further comprise a lamination of a nickel plating layer and a palladium plating layer laminated on said copper-base alloy.

16. A semiconductor device according to claim 15, wherein said copper-base alloy has a roughed surface and said nickel plating layer has a roughed surface.

17. A semiconductor device according to claim 16, wherein said roughed surface of said copper-base alloy has a center line average roughness of 0.1 $\mu$m or more and said roughed surface of said nickel plating layer has a center line average roughness of 0.045 $\mu$m or more.

18. A semiconductor device according to claim 11, wherein said die pad and said terminals comprise an iron-base alloy.

19. A semiconductor device according to claim 18, wherein said die pad and said terminals further comprise a palladium plating layer formed on said iron-base alloy.

20. A semiconductor device according to claim 19, wherein said iron-base alloy has a roughed surface.

21. A semiconductor device according to claim 20, wherein said roughed surface of said iron-base alloy has a center line average roughness of 0.1 $\mu$m or more.

22. A semiconductor device, comprising:

a semiconductor element;

a plurality of terminals aligned with each other, electrically connected to said semiconductor element, and having a top surface defining a plane;

a die pad fixed to said semiconductor element, electrically independent from said terminals, and having top surface in said plane; and a resin configured to embed said semiconductor element, at least one portion of said die pad, and at least one portion of each of said terminals, wherein said die pad has a uniform thickness and further comprises a bottom surface completely exposed to the outside of said resin and flush with an outer surface of said resin, and each of said terminals comprises a bottom surface flush with an outer surface of said resin and exposed to the outside of said resin.

23. A semiconductor device according to claim 22, further comprising an outer electrode formed on said bottom surface of each of said terminals, wherein said outer electrode comprises solder.

24. A semiconductor device according to claim 22, wherein said die pad and said terminals comprise a copper-base alloy.

25. A semiconductor device according to claim 24, wherein said die pad and said terminals further comprise a lamination of a nickel plating layer and a palladium plating layer laminated on said copper-base alloy.

26. A semiconductor device according to claim 25, wherein said copper-base alloy has a roughed surface and said nickel plating layer has a roughed surface.

27. A semiconductor device according to claim 26, wherein said roughed surface of said copper-base alloy has a center line average roughness of 0.1 µm or more and said roughed surface of said nickel plating layer has a center line average roughness of 0.045 µm or more.

28. A semiconductor device according to claim 22, wherein said die pad and said terminals comprise an iron-base alloy.

29. A semiconductor device according to claim 28, wherein said die pad and said terminals further comprise a palladium plating layer formed on said iron-base alloy.

30. A semiconductor device according to claim 29, wherein said iron-base alloy has a roughed surface.

31. A semiconductor device according to claim 30, wherein said roughed surface of said iron-base alloy has a center line average roughness of 0.1 µm or more.

32. A semiconductor device, comprising:
a semiconductor element;
a plurality of terminals aligned with each other, electrically connected to said semiconductor element, and having a top surface defining a plane;
a plurality of leads integrally interconnected to said terminals, fixed to said semiconductor element, and arranged electrically independent of one another; and
a resin configured to completely seat said semiconductor element and said leads, and to embed at least one portion of each of said terminals,
wherein each of said leads comprises a top surface leveled with said plane defined by said top surfaces of said terminals, and is thinner than said terminals.

33. A semiconductor device according to claim 32, further comprising an outer electrode formed on said bottom surface of each of said terminals, wherein said outer electrode comprises solder.

34. A semiconductor device according to claim 32, wherein said leads and said terminals comprise a copper-base alloy.

35. A semiconductor device according to claim 34, wherein said leads and said terminals further comprise a lamination of a nickel plating layer and a palladium plating layer laminated on said copper-base alloy.

36. A semiconductor device according to claim 35, wherein said copper-base alloy has a roughed surface and said nickel plating layer has a roughed surface.

37. A semiconductor device according to claim 36, wherein said roughed surface of said copper-base alloy has a center line average roughness of 0.1 µm or more and said roughed surface of said nickel plating layer has a center line average roughness of 0.045 µm or more.

38. A semiconductor device according to claim 32, wherein said leads and said terminals comprise an iron-base alloy.

39. A semiconductor device according to claim 38, wherein said leads and said terminals further comprise a palladium plating layer formed on said iron-base alloy.

40. A semiconductor device according to claim 39, wherein said iron-base alloy has a roughed surface.

41. A semiconductor device according to claim 40, wherein said roughed surface of said iron-base alloy has a center line average roughness of 0.1 µm or more.

42. A circuit member for a resin-sealed semiconductor device, comprising:
an outer frame member;
a plurality of terminals independently connected via connection leads to said outer frame member; and
a die pad connected via connection leads to said outer frame member,
wherein each of said terminals comprises a top surface defining a plane and each of said connection leads is thinner than said terminals.

43. A circuit member according to claim 42, wherein said die pad is thinner than said terminals and comprises a top surface leveled with said plane defined by said top surface of said terminals.

44. A circuit member according to claim 42, wherein said die pad comprises a top surface leveled with said plane defined by said top surface of said terminals.

45. A circuit member according to claim 42, wherein said die pad is thinner than said terminals and comprises a bottom surface leveled with a plane defined by a bottom surface of said terminals.

46. A circuit member according to claim 42, wherein said circuit member comprise a copper-base alloy.

47. A circuit mender according to claim 46, wherein said circuit member further comprises a lamination of a nickel plating layer and a palladium plating layer laminated on said copper-base alloy.

48. A circuit member according to claim 47, wherein said copper-base alloy has a roughed surface and said nickel plating layer has a roughed surface.

49. A circuit member according to claim 48, wherein said roughed surface of said copper-base alloy has a center line average roughness of 0.1 µm or more and said roughed surface of said nickel plating layer has a center line average roughness of 0.045 µm or more.

50. A circuit member according to claim 42, wherein said circuit member comprises an iron-base alloy.

51. A circuit member according to claim 50, wherein said circuit member further comprises a palladium plating layer formed on said iron-base alloy.

52. A circuit member according to claim 51, wherein said iron-base alloy has a roughed surface.

53. A circuit member according to claim 52, wherein said roughed surface of said iron-base alloy has a center line average roughness of 0.1 µm or more.

54. A circuit member for a resin-sealed semiconductor device, comprising:
an outer frame member;
a plurality of terminals independently connected via connection leads to said outer frame member; and
a lead integrally interconnected to each of said terminals,
wherein each of said terminals comprises a top surface defining a plane, each of said leads comprises a top surface leveled with said plane, and each of said connection leads and each of said leads are thinner than said terminals.

55. A circuit member according to claim 54, wherein said circuit member comprises a copper-base alloy.

56. A circuit member according to claim 55, wherein said circuit member further comprises a lamination of a nickel plating layer and a palladium plating layer laminated on said copper-base alloy.

57. A circuit member according to claim 56, wherein said copper-base alloy has a roughed surface and said nickel plating layer has a roughed surface.

58. A circuit member according to claim 57, wherein said roughed surface of said copper-base alloy has a center line average roughness of 0.1 µm or more and said roughed surface of said nickel plating layer has a center line average roughness of 0.045 µm or more.

59. A circuit member according to claim 54, wherein said circuit member comprises an iron-base alloy.

60. A circuit member according to claim 59, wherein said circuit member further comprises a palladium plating layer formed on said iron-base alloy.

61. A circuit member according to claim 60, wherein said iron-base alloy has a roughed surface.

62. A circuit member according to claim 61, wherein said roughed surface of said iron-base alloy has a center line average roughness of 0.1 μm or more.

* * * * *